(12) United States Patent
Sachidanandam et al.

(10) Patent No.: US 10,180,045 B2
(45) Date of Patent: Jan. 15, 2019

(54) SYSTEM AND METHOD OF SELECTING A DRILL BIT AND MODIFYING A DRILL BIT DESIGN

(71) Applicant: Smith International, Inc., Houston, TX (US)

(72) Inventors: Ambalavanan Sachidanandam, The Woodlands, TX (US); Anna Marie Nelson, Ortonville, MI (US)

(73) Assignee: SMITH INTERNATIONAL, INC., Houston, TX (US)

( * ) Notice: Subject to any disclaimer, the term of this patent is extended or adjusted under 35 U.S.C. 154(b) by 853 days.

(21) Appl. No.: 14/477,710

(22) Filed: Sep. 4, 2014

(65) Prior Publication Data

US 2015/0073760 A1    Mar. 12, 2015

Related U.S. Application Data

(60) Provisional application No. 61/874,886, filed on Sep. 6, 2013.

(51) Int. Cl.
*E21B 41/00* (2006.01)
*E21B 10/00* (2006.01)
*G06F 3/0482* (2013.01)

(52) U.S. Cl.
CPC .......... *E21B 41/0092* (2013.01); *E21B 10/00* (2013.01); *G06F 3/0482* (2013.01)

(58) Field of Classification Search
None
See application file for complete search history.

(56) References Cited

U.S. PATENT DOCUMENTS 6,516,293 B1    2/2003 Huang et al.
6,785,641 B1    8/2004 Huang
(Continued)

FOREIGN PATENT DOCUMENTS

CN         1782739 A    6/2006

OTHER PUBLICATIONS

Ford, Robert, "Jul. 2012 World Trends and Technology for Offshore Oil andGas Operations"; Offshore Magazine, Jul. 31, 2012; pp. 1-4; XP055296688; retrieved from Internet: URL:http://www.slb.com/>>/media/Files/smith/industry_articles/201207_drillbit_design_offshore_ia.pdf [retrieved on Aug. 22, 2016].
(Continued)

*Primary Examiner* — Syed A Roni

(57) ABSTRACT

A system for field selecting drill bit includes a server having a computing processor with functionality to perform: receiving a first simulation request, executing a first simulation to generate a first set of performance data, receiving a second simulation request, and executing a second simulation to generate a second set of performance data. A computing device coupled to the server having a graphical user interface with functionality to perform: selecting a baseline bit, inputting a plurality of drilling data, sending the first simulation request, receiving the first set of performance data, presenting the first set of performance data for review, modifying a parameter of a drill bit, sending the second simulation request with the modified parameter, receiving the second set of performance data from the second simulation, and presenting the first set of performance data and the second set of performance data for review.

20 Claims, 25 Drawing Sheets

(56) References Cited

U.S. PATENT DOCUMENTS

| | | | |
|---|---|---|---|
| 6,873,947 | B1 | 3/2005 | Huang et al. |
| 7,020,597 | B2 | 3/2006 | Oliver et al. |
| 7,139,689 | B2 | 11/2006 | Huang |
| 7,464,013 | B2 | 12/2008 | Huang et al. |
| 7,693,695 | B2 | 4/2010 | Huang et al. |
| 7,844,426 | B2 | 11/2010 | Huang |
| 8,401,831 | B2 | 3/2013 | Tang et al. |
| 2004/0000430 | A1 | 1/2004 | King |
| 2004/0143427 | A1 | 7/2004 | Huang et al. |
| 2005/0096847 | A1 | 5/2005 | Huang |
| 2005/0267719 | A1 | 12/2005 | Foucault |
| 2006/0074616 | A1 | 4/2006 | Chen |
| 2007/0021857 | A1 | 1/2007 | Huang |
| 2010/0133008 | A1 | 6/2010 | Gawski et al. |
| 2012/0084125 | A1 | 4/2012 | Chan et al. |
| 2012/0084212 | A1 | 4/2012 | Sinor et al. |
| 2013/0043077 | A1 | 2/2013 | Chen |
| 2013/0117064 | A1* | 5/2013 | Sadeghi ............ G06Q 10/0633 705/7.27 |

OTHER PUBLICATIONS

Supplementary European Search Report dated Aug. 30, 2016, issued by the European Patent Office in related European Patent Application No. EP 14-84-2706 (4 pages).

EPO Communication (Office Action) dated Sep. 14, 2016, issued by the European Patent Office in related European Patent Application No. EP 14-84-2706.5 (6 pages).

International Search Report and Written Opinion issued in corresponding International Application No. PCT/US2014/054306 dated Dec. 22, 2014 (14 pages).

First Office Action and Search Report issued in Chinese Patent Application No. 201480058591.6 dated Apr. 16, 2018, 16 pages.

International Preliminary Report on Patentability issued in International Patent Application No. PCT/US2014/054306 dated Mar. 17, 2016, 10 pages.

\* cited by examiner

FastTrack Eligibility Screen

Reference Number: 64577A0001 ←―1004
Reference Design: 64577A00 ←―1006

1000

FastTrack Eligible:

⬡ 8 digit: No

⬤ 6 digit: Yes

Cutting Structure Summary: ―1008

| Primary: | | |
|---|---|---|
| | 1613 | 7 |
| | 1913 | 4 |
| | 1916 | 17 |
| Backup: | | |
| | 1913 | 6 |

[Back] [Continue]

*FIG. 10C*

Configuration Screen

Reference Bit: 64625B0001
Reference Design: 64625B00
CFG Numbers: New

| Primary: | |
|---|---|
| 1613 | S4 |

Fast Track Eligible: ◯ Yes (Any) ← 1102

Customer Name:
Customer Rep:
Description:

☐ Cutter Configurator Filters:

| Fast Track | | Technology | | Bevel | |
|---|---|---|---|---|---|
| Any ▼ | | Select... ▼ | | ▼ | |
| Sub Type | | Grade | | Surf Treatment | |
| ▼ | | ▼ | | ▼ | |

Apply Filters

| # | Location | Size | Cnt/Bld Spec | Cutter Part | Cutter Desc | |
|---|---|---|---|---|---|---|
| ⊞ | Cone | 1613 | 14 | | | Select |
| ⊞ | Nose | 1613 | 10 | | | Select |

| | | | | |
|---|---|---|---|---|
| Shoulder | 1613 | 21 | | Select |
| Gage | 1613 | 9 | | Select |

⊞ Fast Track Features
- Bit Diameter: 12.250
- Reference Bit Type: MDi616LHPX
- New Bit Type:
- Gage Pad Length: 2
- Gage Pad Features: ☐
- BackReamers Size: ☐
- Managed Depth of Cut: Same as Ref ▶

⊞ Common Features
- Backup Cutters: Same as Ref ▶
- Blades: Same as Ref ▶
- Hydraulics: Same as Ref ▶
- Lo-vibe: Same as Ref ▶
⊞ Other Options
⊞ Simulation Values Customer Commitment: No ▶

☐ Email Link to Configuration on Save

| Save Configuration | Save to ECR |

*FIG. 11A2*

Configuration Screen

Reference Bit: 64625B0001
Reference Design: 64625B00
CFG Numbers: New

| Primary: | | |
|---|---|---|
| | 1613 | S4 |

Fast Track Eligible: ◯ Yes (Any)

Customer Name: XYZ
Customer Rep: PQR
Description: This is a test ECR.

☐ Cutter Configurator Filters:

Fast Track: Any ▼
Sub Type:
Cutter PDC Ho ▼

Technology: Onyx ▼
Grade: ▼

Bevel: SB ▼
Surf Treatment: ▼

Apply Filters

| # | Location | Size | Cnt/Bld Spec | Cutter Part | Cutter Desc | | |
|---|---|---|---|---|---|---|---|
| ⊞ | Cone | 1613 | 14 | | | Select | |
| ⊞ | 15 Nose | 1613 | B1 C5 | | | Select | |

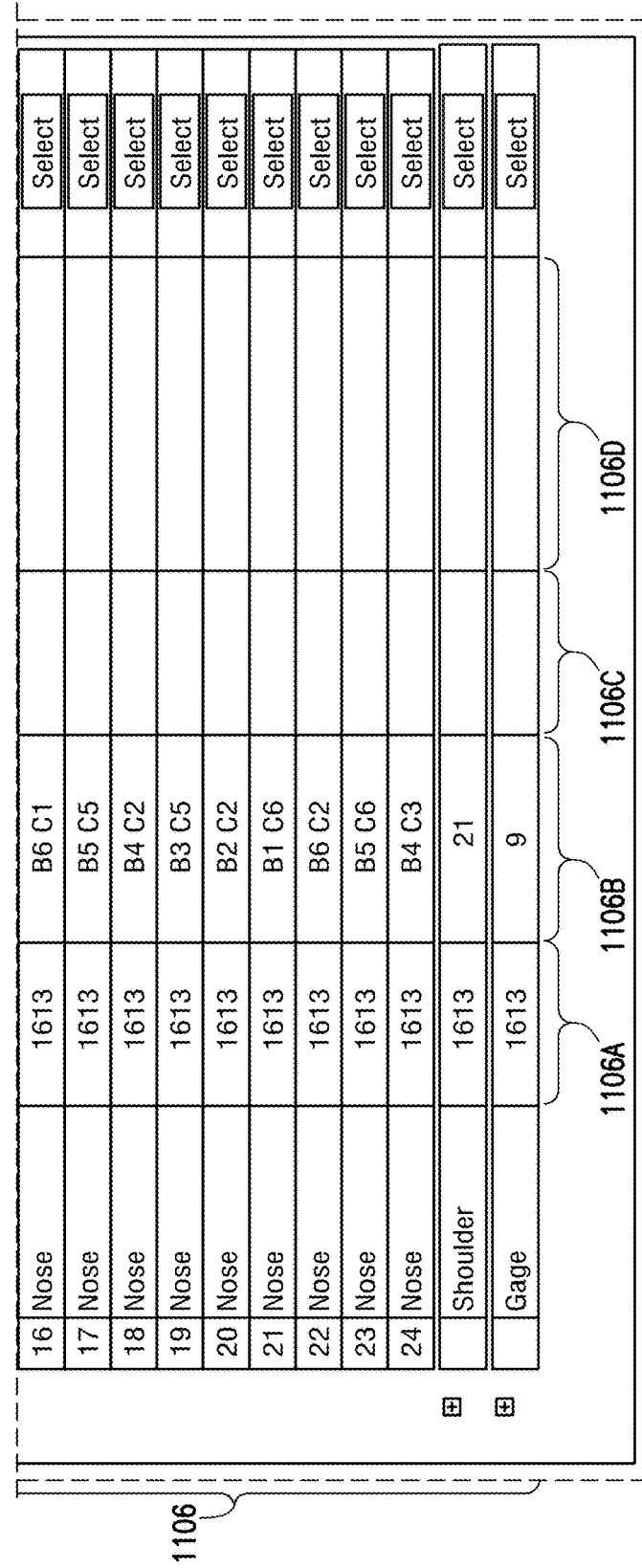
FIG. 11B2

Configuration Screen

- Fast Track Features
  - Bit Diameter: 12.250
  - Reference Bit Type: MDi616LHPX
  - New Bit Type:
  - Gage Pad Length: 2
  - Gage Pad Features: ☑
  - MDOC on Last Gage Cutter: ☐ Used in addition to BGCP. Gives additional gauge protection in applications where breakage is seen. MDOC is built oversize and ground to nominal bit diameter to ensure maximum cutter protection.
  - Gage Pad Undersize: Same as Ref ▶
  - Gage Pad Taper: 1" at Nominal Gage and remainder at
  - Gage Pad Comments:
  - BackReamers Size: ☑
  - Backreamer Size: 1313 (Standard) ▶
  - BackReamers Type: Same as Ref ▶
  - Managed Depth of Cut: Same as Ref ▶

- Common Features
  - Backup Cutters: Same as Ref ▶
  - Blades: Same as Ref ▶
  - Hydraulics: Same as Ref ▶
  - Lo-vibe: Same as Ref ▶

- Other Options
  - Premix on Gage Pad: ☐
  - Gage Protection: Same as Ref ▶
  - Turbine Sleeve: ☑
  - Sleeve Length: ▶  Standard Turbine Sleeve lengths are based on 1.5 times the bit dia. (ex: 8.5 Bit * 1.5 - 12.75 total gage; which includes bit gage length.

FIG. 11C1

| | |
|---|---|
| Sleeve Type: | 3.00 gage on bit and 10.00 sleeve) |
| DOG Sub Sleeve: | Same as Ref |
| Turbine Sleeve Comments: | Same as Ref |
| Active Gage: | Same as Ref |
| Impreg Blade Top: | Same as Ref |
| Impreg Blade Top Comments: | |
| Body Material: | Same as Ref |
| Body Material Comments: | |
| Customer Specific: | ☑ |
| Customer Name: | |
| Bottom Hole Pressure: | |
| Rock Type: | |
| Average WOB for Average ROP: | |
| Average ROP (ft/hr): | 8.0 |
| Maximum ROP (ft/hr): | 120 |
| Total Bit RPM: | 120 |
| Customer Specific Feature Comments: | |
| Connection: | ☑ |
| Connection Type: | Same as Ref |
| Connection Size: | Same as Ref |
| Restrictor Plate: | |
| Float Valve: | ☐ Any Bit with turbine Sleeve Can be modified to accept a float valve. This will add considerable length to bit. |
| PAC Thread Form: | ☐ Currently used only on 2 3/8 Box connection. Make-up torque increased with this thread type: |
| Connection Comments: | |

FIG. 11C2

Configuration Screen — 1116

☐ 1116A

Simulation Values

ROP: 18.00 — 1116C

RPM: 120

Rock: Carthage Marble ▶ 1116B

[Evaluate Contact]

Save Simulation as: [          ] [Save Simulation]

Customer Commitment: [No ▼]

☐ Email me a direct link to this configuration after saving

[Save Configuration]   [Save to ECR]

SYSTEM AND METHOD OF SELECTING A DRILL BIT AND MODIFYING A DRILL BIT DESIGN

BACKGROUND

FIG. 1 shows one example of a conventional drilling system for drilling an earth formation. The drilling system includes a drilling rig 10 used to turn a drilling tool assembly 12 that extends downward into a well bore 14. The drilling tool assembly 12 includes a drill string 16, and a bottomhole assembly (BHA) 18, which is attached to the distal end of the drill string 16. The "distal end" of the drill string is the end furthest from the drilling rig.

The drill string 16 includes several joints of drill pipe 16a connected end to end through tool joints 16b. The drill string 16 is used to transmit drilling fluid (through its hollow core) and to transmit rotational power from the drill rig 10 to the BHA 18. In some cases the drill string 16 further includes additional components such as subs, pup joints, etc.

The BHA 18 includes at least a drill bit 20. BHA's may also include additional components attached between the drill string 16 and the drill bit 20. Examples of additional BHA components include drill collars, stabilizers, measurement-while-drilling (MWD) tools, logging-while-drilling (LWD) tools, subs, hole enlargement devices (e.g., hole openers and reamers), jars, accelerators, thrusters, downhole motors, and rotary steerable systems.

In general, drilling tool assemblies 12 may include other drilling components and accessories, such as special valves, such as kelly cocks, blowout preventers, and safety valves. The drill bit 20 in the BHA 18 may be any type of drill bit suitable for drilling earth formation. Two common types of drill bits used for drilling earth formations are fixed-cutter (or fixed-head) bits and roller cone bits. FIG. 2 shows one example of a fixed-cutter bit. FIG. 3 shows one example of a roller cone bit.

Referring to FIG. 2, fixed-cutter bits (also called drag bits) 21 have a bit body 22 having a threaded connection at one end 24 and a cutting head 26 formed at the other end. The head 26 of the fixed-cutter bit 21 includes a plurality of ribs or blades 28 arranged about the rotational axis of the drill bit and extending radially outward from the bit body 22. Cutting elements 29 are embedded in the raised ribs 28 to cut formation as the drill bit is rotated on a bottom surface of a well bore. Cutting elements 29 of fixed-cutter bits include polycrystalline diamond compacts (PDC) or specially manufactured diamond cutters. These drill bits are also referred to as PDC bits.

Referring to FIG. 3, roller cone bits 30 include a bit body 32 having a threaded connection at one end 34 and one or more legs extending from the other end. A roller cone 36 is mounted on each leg and is able to rotate with respect to the bit body 32. On each cone 36 of the drill bit 30 are a plurality of cutting elements 38, arranged in rows about the surface of the cone 36 to contact and cut through formation encountered by the drill bit. Roller cone bits 30 are designed such that as a drill bit rotates, the cones 36 of the roller cone bit 30 roll on the bottom surface of the well bore (called the "bottomhole") and the cutting elements 38 scrape and crush the formation beneath them. In some cases, the cutting elements 38 on the roller cone bit 30 include milled steel teeth formed on the surface of the cones 36. In other cases, the cutting elements 38 include inserts embedded in the cones. These inserts are tungsten carbide inserts or polycrystalline diamond compacts. In some cases hardfacing is applied to the surface of the cutting elements and/or cones to improve wear resistance of the cutting structure.

For a drill bit 20 to drill through formation, sufficient rotational moment and axial force should be applied to the drill bit 20 to cause the cutting elements of the drill bit 20 to cut into and/or crush formation as the drill bit is rotated. The axial force applied on the drill bit 20 is referred to as the "weight on bit" (WOB). The rotational moment applied to the drilling tool assembly 12 at the drill rig 10 (by a rotary table or a top drive mechanism, for example) to turn the drilling tool assembly 12 is referred to as the "rotary torque." The speed at which the rotary table rotates the drilling tool assembly 12, measured in revolutions per minute (RPM), is referred to as the "rotary speed." Additionally, the portion of the weight of the drilling tool assembly supported at the rig 10 by the suspending mechanism (or hook) may be referred to as the hook load.

SUMMARY

In general, in one aspect, the present disclosure relates to a system for field selecting drill bits, including a server residing at a first location, and including a computing processor executing instructions to perform: receiving a first simulation request, executing, based on the first simulation request, a first simulation to generate a first set of performance data, receiving a second simulation request, and executing, based on the second simulation request, a second simulation to generate a second set of performance data; and a computing device communicatively coupled to the server, residing at a second location, and including a graphical user interface executing on a computer processor with functionality to perform: selecting a baseline bit from a library of bits, inputting a plurality of drilling data, sending the first simulation request including the baseline bit and the plurality of drilling data, receiving the first set of performance data, presenting the first set of performance data for review, modifying a feature of the baseline bit, wherein modifying involves selecting a pre-existing value for the feature to obtain a modified bit, sending the second simulation request including the modified bit, receiving the second set of performance data from the second simulation, presenting, on the graphical user interface, the first set of performance data and the second set of performance data for review, and selecting a drill bit based on the first and second sets of performance data.

Other aspects of field selecting drill bits will be apparent from the following description and appended claims.

BRIEF DESCRIPTION OF DRAWINGS

The appended drawings illustrate several embodiments of selecting a drill bit and modifying a drill bit design and are not to be considered limiting of its scope, for selecting a drill bit and modifying a drill bit design may admit to other equally effective embodiments.

FIGS. 10A-10C show examples of a graphical user interface in accordance with one or more embodiments.

FIGS. 11A1-11E show examples of a graphical user interface in accordance with one or more embodiments.

DETAILED DESCRIPTION

Figure 1:
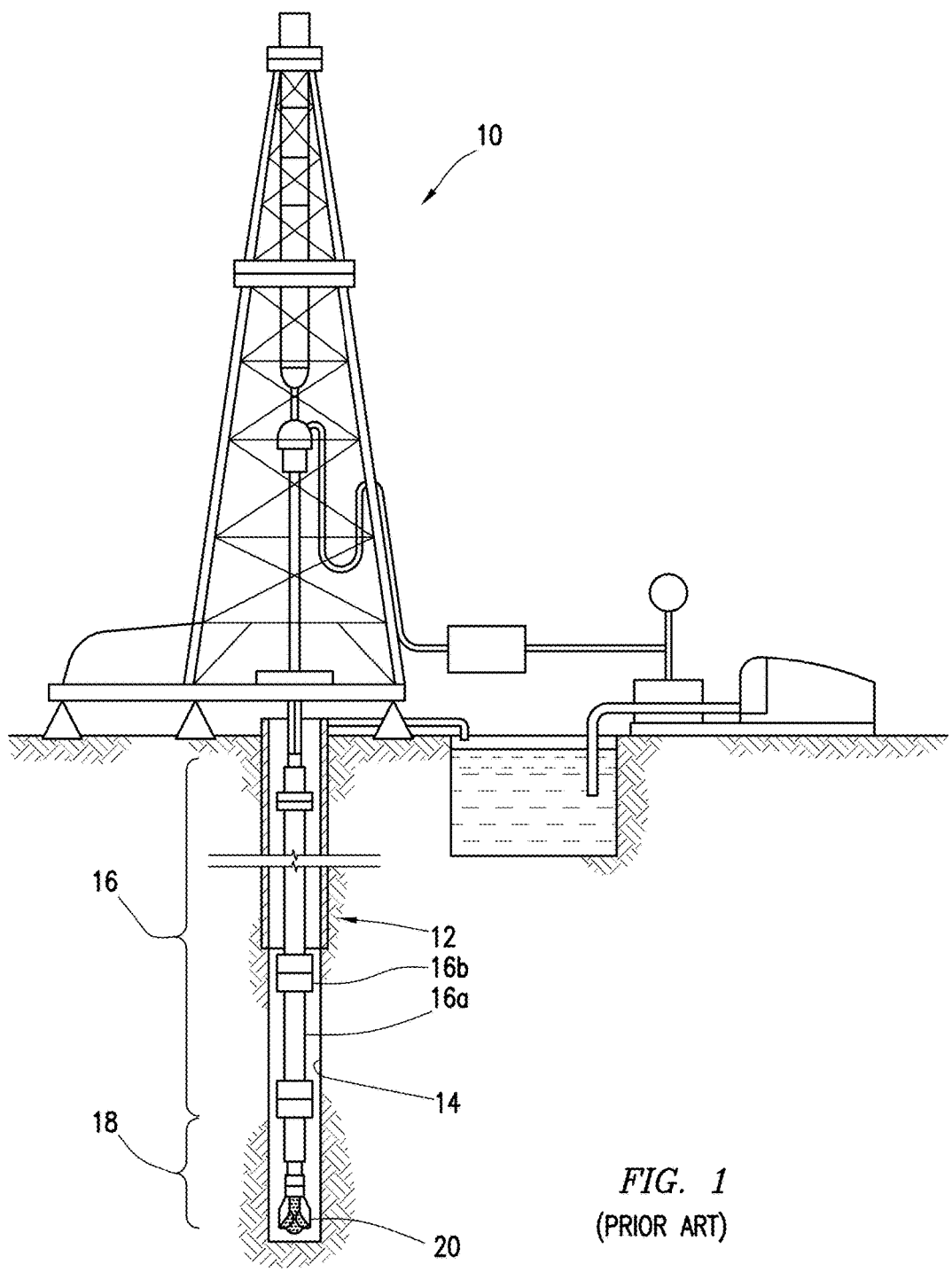
FIG. 1 shows a conventional drilling system for drilling an earth formation.

Aspects of the present disclosure are shown in the above-identified drawings and described below. In the description, like or identical reference numerals are used to identify common or similar elements. The drawings are not necessarily to scale and certain features may be shown exaggerated in scale or in schematic in the interest of clarity and conciseness.

Embodiments disclosed herein provide systems and methods for selecting a drill bit or modifying a drill bit design to help engineers (or other users) choose or design an optimal drill bit. More particularly, one or more embodiments disclosed herein provide for systems and methods of comparing various drill bits with one another or against selected criteria, to determine which bit may be appropriate for a particular drilling operation. In other embodiments, a drill bit designer may make changes to structural features of the drill bit in order to satisfy one or more criteria.

"Drilling data" may include one or more of rate of penetration (ROP, the rate at which the drill bit penetrates the formation through which the borehole is being drilled), rotary torque to turn the drilling tool assembly, rotary speed at which the drilling tool assembly is turned, drilling tool assembly lateral, axial, or torsional vibrations induced during drilling, and weight on bit (WOB), for example. One skilled in the art will appreciate that other types of drilling data exist and may be considered without departing from the scope of the disclosure.

"Drilling performance parameters" may include one or more of forces acting on components of the drilling tool assembly, forces acting on the drill bit and components of the drill bit (e.g., on blades, cones, and/or cutting elements), and inclination angle and azimuth direction of the borehole being drilled. One skilled in the art will appreciate that other drilling performance parameters exist and may be considered without departing from the scope of the disclosure.

"Drill bit parameters" may include one or more of the following: the type, location, and number of components included in the drilling tool assembly; the length, internal diameter of components, outer diameter of components, weight, and material properties of each component; the type, size, weight, configuration, and material properties of the drilling tool; and the type, size, number, location, orientation, and material properties of the cutting elements on the drilling tool assembly. Material properties in designing a drilling tool assembly may include, for example, the strength, elasticity and density of the material, for example. Other examples of drill bit parameters may include one or more of the following: bit type (i.e., fixed or roller cone), size of bit, shape of bit, the cutting structures on the drill bit, such as cutting element geometry, quantity, and locations. Drill bit parameters may also include one or more of depth of cut (e.g., exposure relative to cutter, exposure relative to geometry, exposure relative to location), carbide inserts on the blades adjacent to one or more cutters (e.g., to distribute load) (e.g., exposure of inserts, geometry of inserts, and location of inserts), backup cutter properties (e.g., exposure of backup cutter, location of backup cutter), blade properties (e.g., blade geometry, blade exposure, blade width), gage pad properties (e.g., gage pad geometry, gage pad length, gage pad features), and bit diameter. It should be understood that drill bit parameters may include any other configuration or material parameter of the drilling tool assembly without departing from the scope of the present disclosure.

"Well bore parameters" may include one or more of the following: the geometry of a well bore and formation material properties (i.e., geologic characteristics). The trajectory of a well bore in which the drilling tool assembly is to be confined also is defined along with an initial well bore bottom surface geometry. Because the well bore trajectory may be straight, curved, or a combination of straight and curved sections, well bore trajectories, in general, may be defined by defining parameters for each segment of the trajectory. For example, a well bore may be defined as having N segments characterized by the length, diameter, inclination angle, and azimuth direction of each segment and an indication of the order of the segments (i.e., first, second, etc.). Well bore parameters defined in this manner can then be used to mathematically produce a model of the entire well bore trajectory. Formation material properties at various depths along the well bore may also be defined and used. One of ordinary skill in the art will appreciate that well bore parameters may include additional properties, such as friction of the walls of the well bore and well bore fluid properties, without departing from the scope of the disclosure.

As used herein, a "drilling simulation" is a dynamic or static simulation of a drill bit used in a drilling operation. The drilling simulation is referred to as being "static" when the interaction of the BHA with the wellbore is not considered. The drilling simulation is referred to as being "dynamic" when the BHA is considered with additional degrees of freedom. Methods for such drilling simulations are known to the assignee of the current application, such as those disclosed in U.S. Pat. Nos. 6,516,293, 6,873,947, 7,844,426, 7,139,689, 6,785,641, 8,401,831, 7,020,597, 7,693,695, and 7,464,013 as well as U.S. Patent Publication Nos. 2004/0143427 and 2005/0096847, each of which are incorporated by reference in their entirety.

A considerable amount of resources may be involved in the design and manufacture of drill bits. Therefore, in order to optimize drill bit performance, engineers may consider a variety of drilling factors. For example, when selecting and/or designing a drill bit, engineers may consider a rock profile (e.g., the type of rock or the geologic characteristics of an earth formation). Engineers may also consider different forces acting on the drill bit, drilling performance parameters, drill bit parameters and/or well bore parameters, among others.

When considering different drilling factors, engineers may compare the parameters of one drill bit to the parameters of another drill bit. However, without accurate models or simulations of drill bits and how they operate based on the drilling factors (e.g., rock profile, drilling performance parameters, drill bit parameters, etc.), engineers may not be provided with enough quantitative and substantial information to make an optimal or appropriate drill bit choice. Therefore, comparison of different drill bits, along with comparison of different drill bit parameters, may be helpful in determining the optimal drill bit to be used during drilling or any other operation.

On the other hand, access to detailed models or simulations may depend on resources (e.g., computational and/or storage resources) available on site, whether in the field or at any other location having limited access to resources. Additionally, it may be helpful for engineers to have the ability to compare drill bits based on drilling factors such as, for example, the rock profile, drilling performance parameters, and/or drill bit parameters using detailed models or simulations. Such comparisons would enable drilling engineers to optimally select or modify a drill bit for use in the field, or for use in any other operation.

Figure 4:
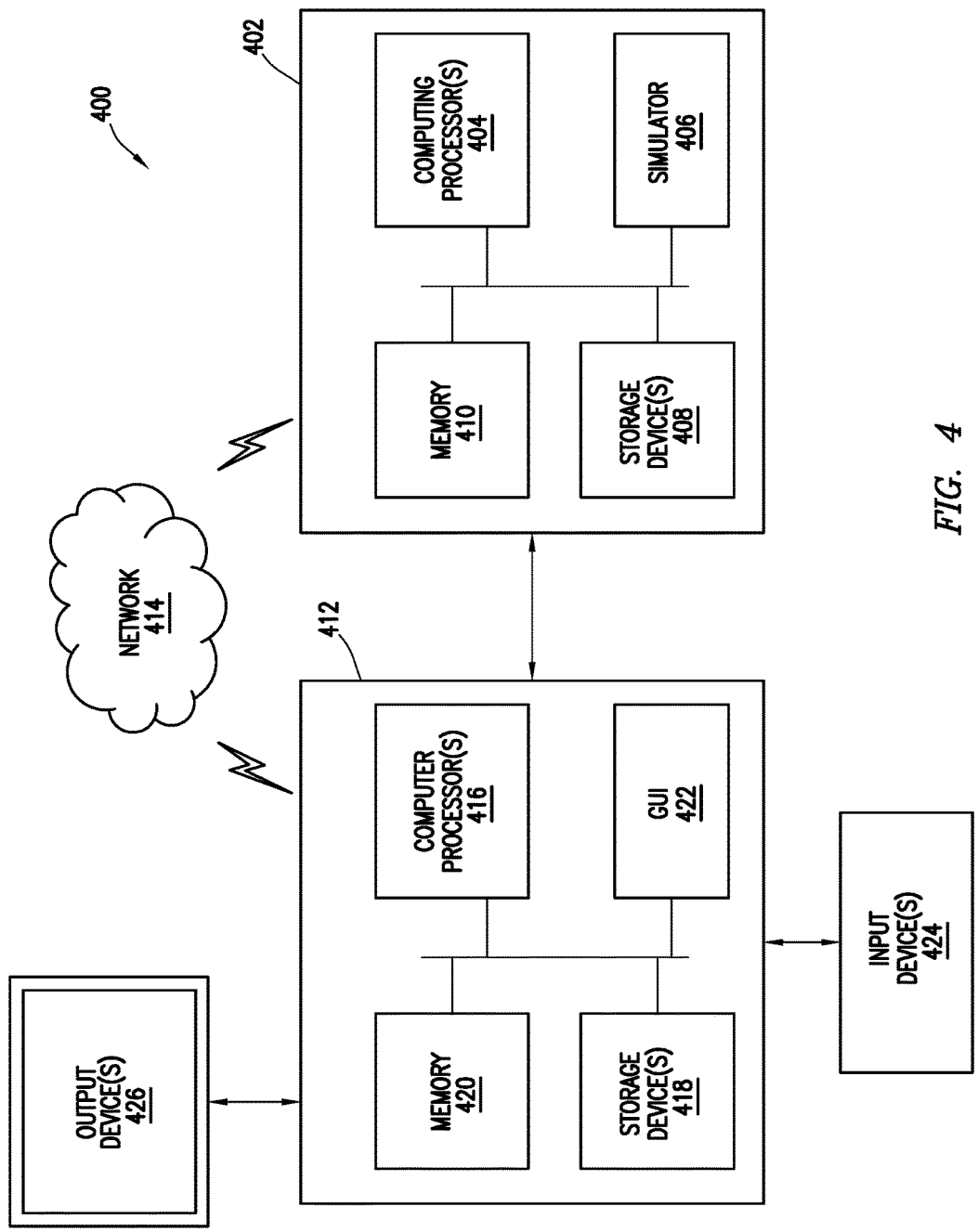
FIG. 4 shows an example of a system in accordance with one or more embodiments.

FIG. 4 depicts a system with which one or more embodiments of selecting a drill bit or modifying a drill bit design may be implemented. In one or more embodiments, one or more of the modules and elements shown in FIG. 4 may be omitted, repeated, and/or substituted. Accordingly, embodiments of selecting a drill bit or modifying a drill bit design should not be considered limited to the specific arrangements of modules shown in FIG. 4.

In one or more embodiments, a drill bit may be selected in the field (e.g., at the site of the well) or at another location (e.g., remote location). Referring to FIG. 4, a system 400 includes a server 402 having one or more computing processors 404, a simulator 406, one or more storage devices 408 (e.g., a hard disk, an optical drive such as a compact disk (CD) drive or digital versatile disk (DVD) drive, a flash memory stick, etc.), and memory 410 (e.g., random access memory (RAM), cache memory, flash memory, etc.). The computing processor(s) 404 may be an integrated circuit for processing instructions. For example, the computing processor(s) may be one or more cores, or micro-cores of a processor. The storage device(s) 408 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 408 may be a device internal to the server 402. The storage device(s) 408 may be an external storage device operatively connected to the server 402. Additionally, the server 402 may include numerous other elements and functionalities.

The server 402 may be communicatively coupled to a computing device 412 (e.g., through wires, cables, fibers, optical connectors, or a wireless connection). The server 402 may be coupled to the computing device 412 through a network 414 (e.g., a local area network (LAN), a wide area network (WAN) such as the Internet, mobile network, or any other type of network) via a network interface connection (not shown).

The computing device 412 may include one or more computer processors 416, one or more storage devices 418 (e.g., a hard disk, an optical drive such as a compact disk (CD) drive or digital versatile disk (DVD) drive, a flash memory stick, etc.), memory 420 (e.g., random access memory (RAM), cache memory, flash memory, etc.), and a graphical user interface (GUI) 422, as shown. The computer processor(s) 416 may be an integrated circuit for processing instructions. For example, the computer processor(s) may be one or more cores, or micro-cores of a processor. The storage device(s) 418 (and/or any information stored therein) may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The storage device(s) 418 may be a device internal to the computing device 412. Further, the storage device(s) 418 may include an external storage device operatively connected to the computing device 412. Additionally, the computing device 412 may include numerous other elements and functionalities.

The system 400 may also include one or more input device(s) 424, such as a touchscreen, keyboard, mouse, microphone, touchpad, electronic pen or any other type of input device. Further, the system 400 may include one or more output device(s) 426, such as a screen (e.g., a liquid crystal display (LCD), a plasma display, touchscreen, cathode ray tube (CRT) monitor, projector, 2D display, 3D display, or other display device), a printer, external storage, or any other output device. One or more of the output device(s) 426 may be the same or different from the input device(s). The input and output device(s) may be locally or remotely (e.g., via the network 414) connected to the computer processor(s) (404 and/or 416), memory (410 and/or 420), storage device(s) (408 and/or 418), simulator 406, and GUI 422. Many different types of systems exist, and the aforementioned input and output device(s) may take other forms.

Further, one or more elements of the aforementioned system 400 may be located at a remote location and connected to the other elements over a network 414. Further, embodiments of the disclosure may be implemented on a distributed system having a plurality of nodes, where each portion of the disclosure may be located on a different node within the distributed system. In one embodiment of the disclosure, the node corresponds to a distinct computing device. The node may correspond to a computer processor with associated physical memory and/or a computer processor or micro-core of a computer processor with shared memory and/or resources.

The GUI 422 may operated by a user (e.g., a third party, an engineer, a designer, an operator, a customer, an employee, or any other party) using one or more input devices 424. In one or more embodiments, the GUI 422 may be used for interacting with the user, e.g. to receive input or select options. In addition, the GUI 422 may include one or more widgets (e.g. drop down lists, text boxes, radio buttons, etc.) used to interact with a user. Further, the GUI 422 may be visualized on one or more output devices 426 coupled to the computing device 412. Although the output device(s) 426 is shown as being communicatively coupled to the computing device 412, the output device(s) 426 may also be a component of the computing device 412.

In one or more embodiments, in addition to selecting a drill bit from a pre-existing library of drill bits, the simulation request may be customized, by the user, using the graphical user interface 422 of the computing device 412. The user may customize the simulation request by inputting or selecting a variety of drilling factors (e.g., rock profile, drilling performance parameters, drill bit parameters, etc.). As discussed above, the user may also modify a parameter of the drill bit to be used in the simulation request. Additionally, the simulation request may be customized by inputting or selecting a variety of drilling data. To modify the drill bit and/or customize the simulation request, the user may access storage devices(s) 418 or 408 using any input means known in the art (e.g., input device(s) 424). The storage device(s) 414 is capable of having data stored thereon and may include, for example, libraries of rock profiles, drill bits, drilling performance parameters, and/or drill bit parameters, among others. The library may be visualized by the GUI 422 on one or more output devices 426.

In FIG. 4, the server 402 is capable of receiving a simulation request from the computing device 412. In one or more embodiments, the simulation request may include a request to simulate, statically and/or dynamically, a drill bit. The drill bit to be simulated may be selected, by a user, from a pre-existing library of drill bits (not shown). For example, a company may generate and maintain a log, journal and/or record of drill bits that have been used or designed in the past and any of these drill bits, among others, may be stored in the pre-existing library of drill bits. Further, the pre-existing library of drill bits may be stored on storage device(s) 418 or may be stored on storage device(s) 408 in which the computing device 412 may have permission to access. Selecting the drill bit from the pre-existing library of drill bits may be done by the user using the GUI 422, executed by the computing processor(s) 416 and may be visualized on one or more output devices 426.

Furthermore, the selected drill bit may be modified by changing a drill bit parameter. For example, the drill bit parameter may be any one angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, among others. Modification may involve selecting a parameter from pre-existing values for the drill bit parameter to obtain a modified drill bit. The pre-existing values may depend on manufacturing capabilities or geometries of the drill bit. For example, a particular cutter may be allowed to have certain angles based on the location of adjacent cutters. In addition, pre-existing values may also depend on commonly used values or may be limited to a reasonable number of values for a given parameter.

In one or more embodiments, in addition to selecting a drill bit from a pre-existing library of drill bits, the simulation request may be customized, by the user, using the graphical user interface 422 of the computing device 412. The user may customize the simulation request by inputting or selecting a variety of drilling factors (e.g., rock profile, drilling performance parameters, drill bit parameters, etc.). As discussed above, the user may also modify a parameter of the drill bit to be used in the simulation request. Additionally, the simulation request may be customized by inputting or selecting a variety of drilling data. To modify the drill bit and/or customize the simulation request, the user may access storage devices(s) 418 or 408 using any input means known in the art (e.g., input device(s) 424). The storage device(s) 418 or 408 is capable of having data stored thereon and may include, for example, libraries of rock profiles, drill bits, drilling performance parameters, and/or drill bit parameters, among others. The library may be visualized by the GUI 422 on one or more output devices 426.

In addition, the drill bit may be selected for simulation or modified based on data input or selected by the user. Based on the data, the computing device 412 may present to the user a number of drill bits from the pre-existing library of drill bits for selection. The user may select one or more drill bits from the number of available drill bits to be included in the simulation request. Based on the selected drill bit, a number of drill bit parameters may also be presented to the user via the GUI 422.

In one or more embodiments, the user may also modify a drill bit based on particular drilling requirements. For example, a user may determine a specific weight on bit or rate of penetration and may modify the drill bit accordingly taking into account the specific weight on bit and/or rate of penetration, among other drilling factors. If the modified drill bit does not exist in the pre-existing library of drill bits, the modified drill bit may still be selected and may later be added to the library of drill bits for future use.

Once the user customizes the simulation request, the simulation request may be sent from the computing device 412 to the server 402 using the network 414. After receiving the simulation request from the computing device 412, the simulator 406 executes a simulation based on the simulation request. The simulator 406 may execute instructions on the computing processor(s) 404 to perform a simulation based on the received simulation request. The drilling simulation may be performed using one or more of the methods set forth above.

Executing the simulation generates a set of performance data. In some cases, the set of performance data generated may depend on the simulation request. The simulation request may include instructions to generate specific performance data, such as, but not limited to, contact area, cutter forces, pull, circumferential forces, and/or work rate. Additionally, the performance data may include bit geometry and/or bit stability. In other cases, the set of performance data to be generated may depend on specific criteria, which can be pre-set or configured at any other time. The set of performance data and specific criteria, for example, may be stored on either or both of storage device(s) 408 and 418, for example.

In one or more embodiments, the set of performance data may be sent by the server 402 to the computing device 412. The set of performance data may then be visualized by the GUI 422 on the output device(s) 426. Once presented with the set of performance data, the user may modify a parameter of the selected drill bit, modified drill bit or simulation request, such as, for example, a drill bit parameter. As discussed above, the drill bit parameter may be any one of angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, among others.

Modification may involve selecting a parameter from pre-existing values for the drill bit parameter to obtain a modified drill bit. The pre-existing values may depend on manufacturing capabilities or geometries of the drill bit. For example, a particular cutter may be allowed to have certain angles based on the location of adjacent cutters. In addition, pre-existing values may also depend on commonly used values or a reasonable number of values for a given parameter.

After modification, a second simulation request may be sent from the computing device 412 to the server 402. The second simulation request may include the modified drill bit parameter to be simulated. After receiving the simulation request from the computing device 412, the simulator 406 executes a simulation based on the second simulation request (where a drill bit parameter was modified). The simulation may be executed by the simulator 406 using the processor(s) 404 to generate a second set of performance data. The drilling simulation may be performed using one or more of the methods set forth above.

Similar to the first simulation request, the second simulation request may include instructions to generate specific performance data, such as, but not limited to, contact area, cutter forces, pull, circumferential forces, and/or work rate. In other cases, the second set of performance data to be generated may depend on specific criteria, which may be pre-set or configured at any other time.

Once generated, the second set of performance data may be sent from the server 402 to the computing device 412. The computing device 412, using the GUI 422 and the output device(s) 426, is capable of presenting the initial set of performance data along with the second set of performance data. The sets of performance data may be presented to the user for comparison and may be presented separately or combined. The sets of performance data may be presented using any presenting tools known in the art, such as, for example, plots, graphs, charts and logs.

Further, similar to the first and second simulation requests, the selected drill bit may be included in a baseline simulation request to be sent from the computing device 412 to the server 402. The server 402 may run a baseline simulation based on the initial selected drill bit and the baseline simulation request to generate a baseline set of performance data. The computing device 412, using the GUI 422 and the output device(s) 426, is capable of presenting the any one of the baseline set of performance data, the first set of performance data and the second set of performance data. The sets of performance data may be presented to the user for comparison and may be presented separately or combined. The sets of performance data may be presented using any presenting tools known in the art, such as, for example, plots, graphs, charts and logs.

Based on the performance data, a user may select another drill bit or continue to modify one or more parameters of the selected or modified drill bit in hopes of achieving or designing an optimal drill bit. The user may select another drill bit corresponding to any one of the baseline, first, or second sets of performance data, or any other drill bit or simulation.

Figure 5:
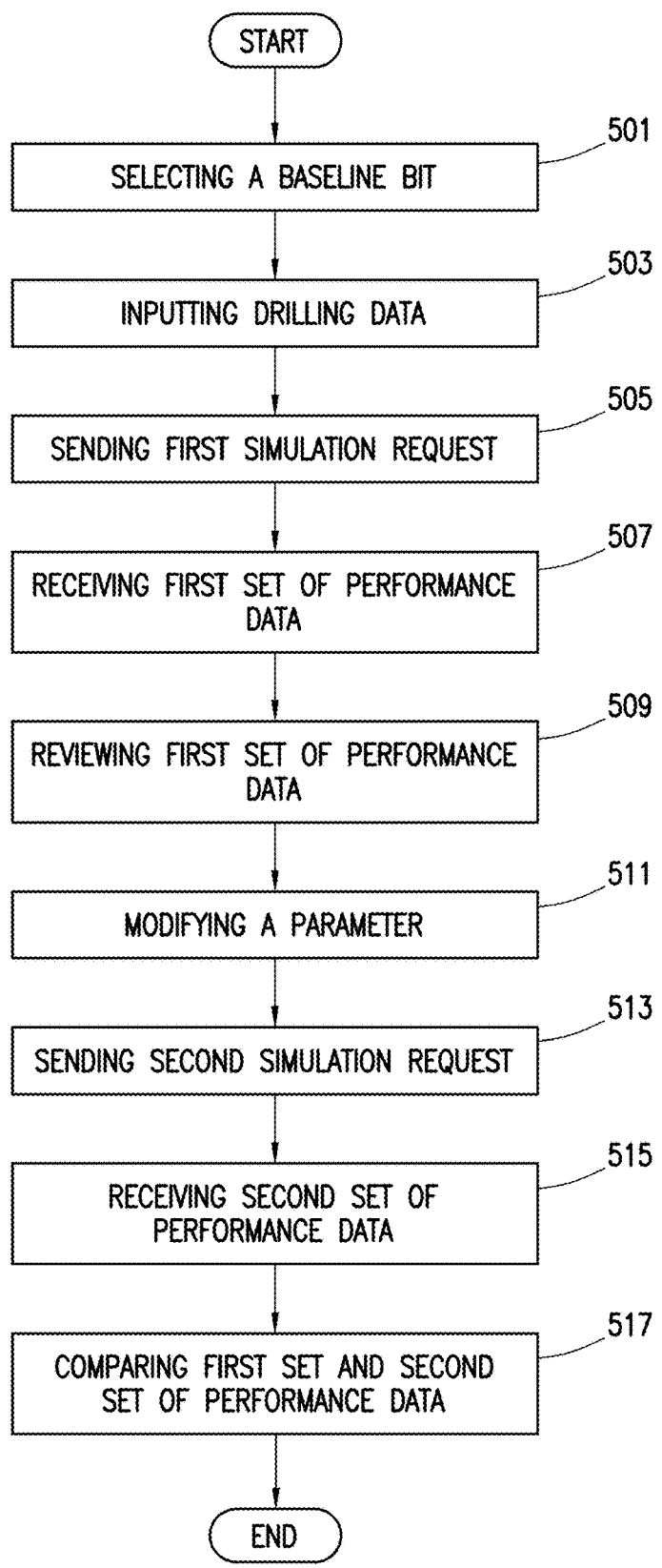
FIGS. 5-9 depict flowcharts of methods in accordance with one or more embodiments.

Referring now to FIG. 5, a flow chart illustrating a method of field testing cutting structure features in accordance with one or more embodiments of the present disclosure is shown. In one or more embodiments, one or more of the modules shown in FIG. 5 may be omitted, repeated, and/or substituted. Accordingly, embodiments of selecting a drill bit or modifying a drill bit design should not be considered limited to the specific arrangements of modules shown in FIG. 5.

In 501, a baseline drill bit is selected. The baseline drill bit may be selected from a pre-existing library of drill bits stored in an input library and may be selected by a user using a graphical user interface, such as GUI 422 as shown in FIG. 4. Similarly, using the graphical user interface, a user may input a variety of drilling data in 503. Drilling data may include, for example, rate of penetration, rotary speed, rotary torque, weight on bit, depth of cut, inclination angle, azimuth direction and a rock profile. One of ordinary skill would understand that drilling data is not limited to the aforementioned variables. As discussed above, a user may use the graphical user interface via any input means known in the art (e.g., input device(s) 424 as shown in FIG. 4).

A first simulation request may be sent (e.g., by the user clicking a button on a GUI) in 503. The first simulation request may include the variety of drilling data input by the user and/or the baseline drill bit selected using the graphical user interface. The first simulation request may be received by a server and a simulation may be executed to generate a first set of performance data. The performance data may include, but not limited to, contact area, cutter forces, pull, circumferential forces, and/or work rate. Further, the first set of performance data to be generated may depend on specific criteria, the variety of drilling data, and/or selected baseline drill bit.

In one or more embodiments, the first set of performance data may be received in 507 for review by the user in 509. Reviewing the first set of performance data may include analysis of graphs or plots, calculations of different variables based on the first set of performance data, and/or rendering visualizations of different parameters and may be reviewed on the GUI. After review, in 511 a parameter may be modified to effectively result in a modified drill bit for use in a second simulation (e.g., based on the first set of performance data). The parameter may be a drilling parameter, such as, angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. The parameter may be modified by selecting a pre-existing value for the parameter to obtain a modified drill bit. For example, the pre-existing value for the parameter may be based on previously manufactured drill bits, commonly used values for the parameter or may be limited to a reasonable number of values based on the number of available parameters to modify.

Using the modified parameter, a second simulation request is sent in 513. The second simulation request may be sent to a server capable of simulating or instructing a simulator to simulate, a drill bit based on the second simulation request, which includes the modified parameter, to generate a second set of performance data. Similarly, the second set of performance data may include, but not limited to, contact area, cutter forces, pull, circumferential forces, work rate, bit geometry and bit stability. Further, the second set of performance data to be generated may depend on specific criteria, the variety of drilling data, and/or the modified drill bit.

The second set of performance data may be received in 515 to be reviewed and compared to the first set of performance data in 517. Reviewing and comparing the first and second sets of performance data may include analysis of graphs or plots, calculations of different variables based on the first set of performance data, and/or rendering visualizations of different parameters. The user may then select a drill bit based on the comparison. Comparing may be done by any third party known (designer, customer, employee, contractor, engineer, driller, etc.).

Figure 6:
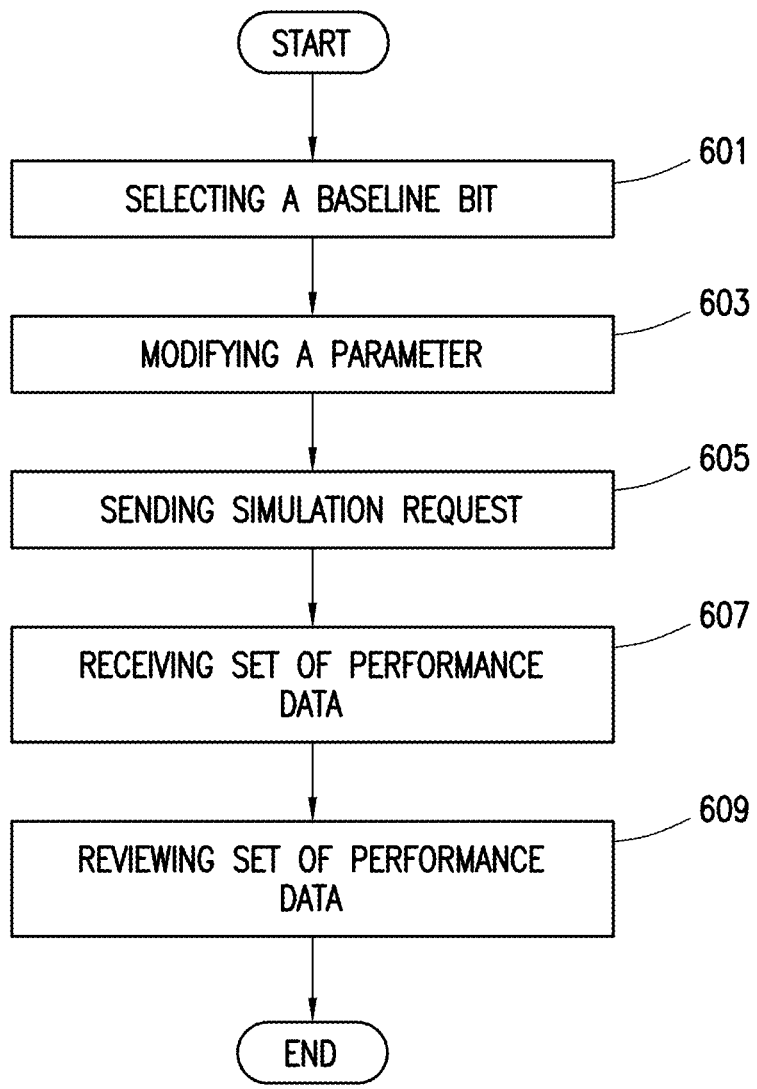

In FIG. 6, a flow chart illustrating a method of field testing drill bit parameters in accordance with one or more embodiments is shown. One or more of the modules shown in FIG. 6 may be omitted, repeated, and/or substituted. Accordingly, embodiments of selecting a drill bit or modifying a drill bit design should not be considered limited to the specific arrangements of modules shown in FIG. 6.

In 601, a baseline bit is selected. The baseline bit may be selected from a pre-existing library of bits and may be selected, by a user, using a graphical user interface. In one or more embodiments, a parameter of the baseline bit may be modified, for example, by a user using a graphical user interface, as shown in 603. The parameter may be any drilling parameter known in the art, such as angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. Further, the parameter may be modified by selecting a pre-existing value for the parameter to obtain a modified parameter.

As shown in 605, a simulation request may be sent to a server. The simulation request may include the selected baseline bit and the modified parameter. The simulation request may be sent to a server capable of simulating or instructing a simulator to simulate, a drill bit based on the simulation request, which includes the modified parameter, to generate a set of performance data. Similarly, the set of performance data may include, but not limited to, contact area, cutter forces, pull, circumferential forces, and/or work rate. Further, the set of performance data may be received in 607 for review in 609.

In 609, the set of performance data is displayed for review by the user. Specifically, the user may review the performance data against one or more criteria. Reviewing may involve presenting, visualizing or comparing the performance data on the graphical user interface. The criteria may be pre-determined based on a variety of drilling factors (e.g., rate of penetration or weight on bit), geologic conditions, or production specifications, such as, for example, borehole or formation characteristics. Further, the criteria may include one or more of stability (i.e., location at the vibrations at the drill bit), steerability, efficiency (i.e., predict the rate of penetration for a given drill bit package in a given formation), the durability (i.e., the resistance to material fatigue and/or failure), and/or the well trajectory (including inclination and azimuthal directions).

Figure 7:
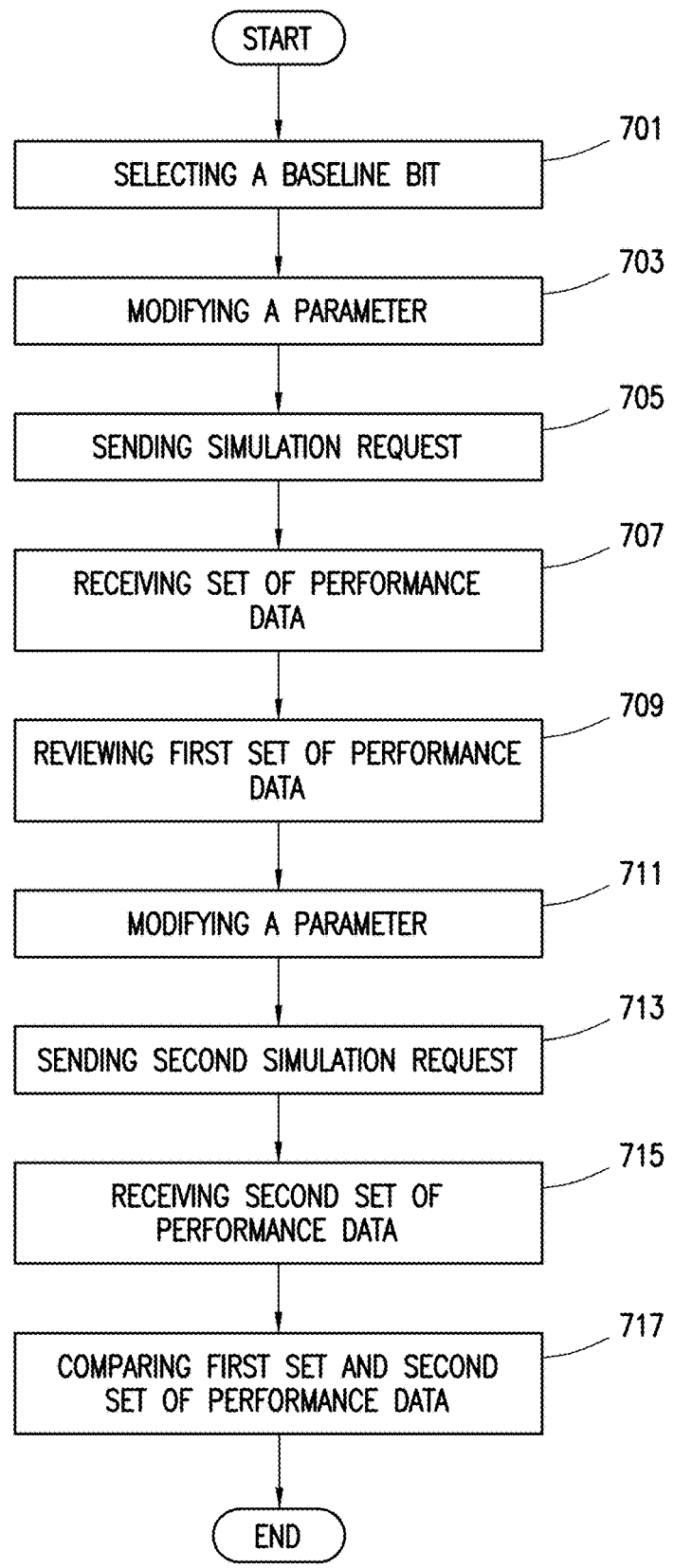

In FIG. 7, a flow chart illustrating a method of testing drill bit parameters in accordance with one or more embodiments is shown. One or more of the modules shown in FIG. 7 may be omitted, repeated and/or substituted. Accordingly, embodiments of selecting a drill bit or modifying a drill bit design should not be considered limited to the specific arrangements of modules shown in FIG. 7.

In 701, a baseline bit is selected. The baseline bit may be selected from a pre-existing library of bits and may be selected, by a user, using a graphical user interface. In one or more embodiments, a parameter of the baseline bit may be modified, for example, by a user using a graphical user interface, as shown in 703. The parameter may be any drilling parameter known in the art, such as, angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. Further, the parameter may be modified by selecting a pre-existing value for the parameter to obtain a modified bit. Modifying one or more parameters of a drill bit effectively creates a new/modified drill bit for simulation.

As shown in 705, a simulation request may be sent to a server. The simulation request may include the modified bit. The simulation request may be sent to a server capable of simulating or instructing a simulator to simulate, drill bit based on the simulation request, which includes the modified bit, to generate a set of performance data. Similarly, the set of performance data may include, but not limited to, contact area, cutter forces, pull, circumferential forces, and/ or work rate. Further, the set of performance data may be received in 707 for review in 709.

In 709, the set of performance data is displayed for review by the user. Specifically, the user may review the performance data against one or more criteria. Reviewing may involve presenting, visualizing or comparing the performance data on the graphical user interface and may also involve analysis of graphs or plots, calculations of different variables based on the first set of performance data, and/or rendering visualizations of different parameters. After review, a parameter may be modified in 711 for a second simulation (e.g., based on the first set of performance data). The parameter may be a drilling parameter, for example. However, one of ordinary skill would know and appreciate that the modified parameter may be any parameter known in the art, such as, angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. The parameter may be modified by selecting a pre-existing value for the drill bit parameter to obtain a modified drill bit. For example, the pre-existing value for the parameter may be based on manufactured drill bits Using the modified parameter, a second simulation request is sent in 713. The second simulation request may be sent to a server capable of simulating or instructing a simulator to simulate, a drill bit based on the second simulation request, which includes the modified parameter, to generate a second set of performance data. Similarly, the second set of performance data may include, but not limited to, contact area, cutter forces, pull, circumferential forces, work rate, bit geometry and bit stability. Further, the second set of performance data to be generated may depend on specific criteria, the variety of drilling data, and/or the modified drill bit.

The second set of performance data may be received in 715 to be reviewed and compared to the first set of performance data in 717. Reviewing and comparing the first and second sets of performance data may include analysis of graphs or plots, calculations of different variables based on the first set of performance data, and/or rendering visualizations of different parameters. The user may then select a drill bit based on the comparison.

Figure 8:
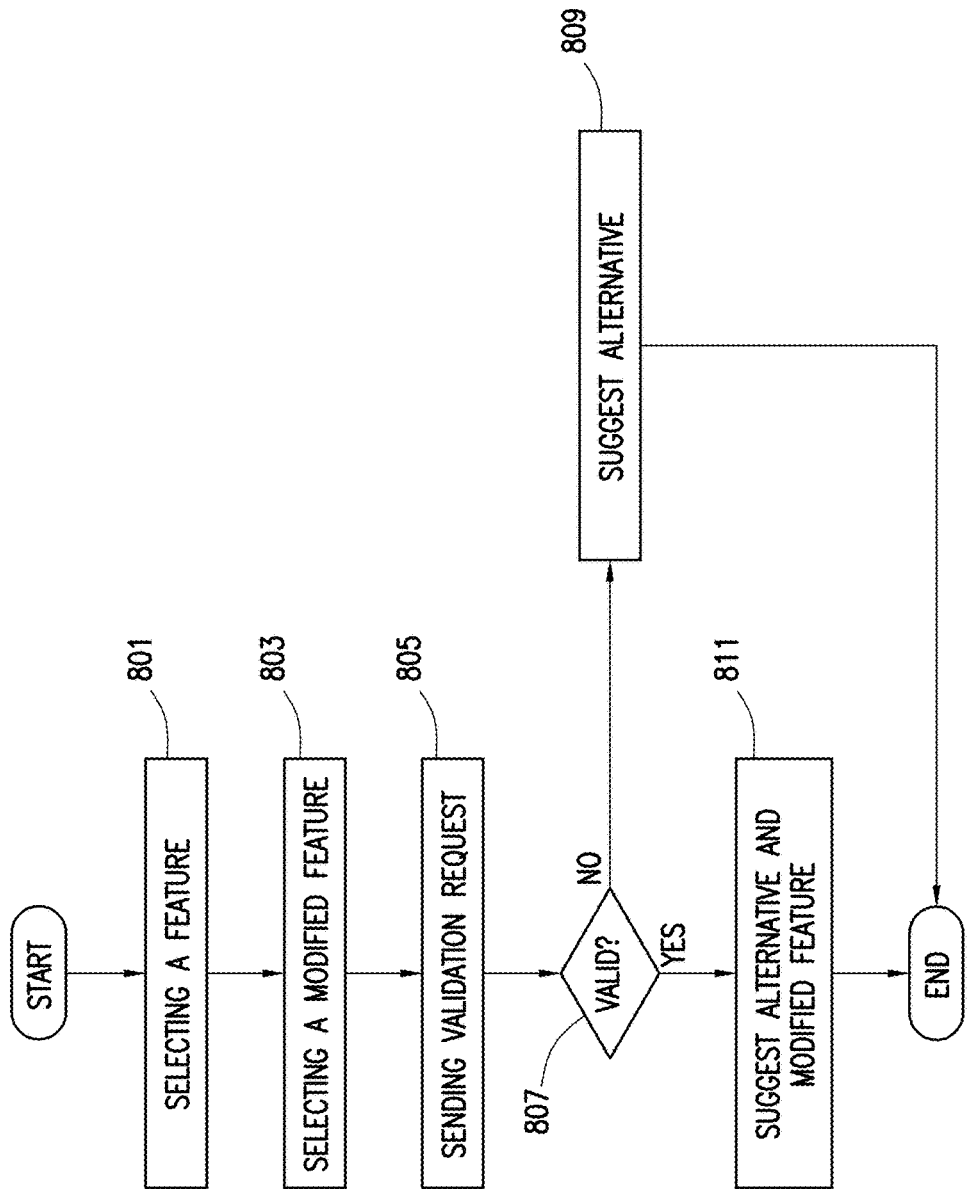

In FIG. 8, a flow chart illustrating a method of modifying a bit in accordance with one or more embodiments is shown. One or more of the modules shown in FIG. 8 may be omitted, repeated and/or substituted. Accordingly, embodiments of selecting a drill bit or modifying a drill bit design should not be considered limited to the specific arrangements of modules shown in FIG. 8.

As shown in 801, a parameter of a drill bit may be selected by a user using a graphical user interface. As discussed above, the drill bit parameter may be any one of angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. In 803, the selected parameter of the drill bit may be modified to effectively create a modified drill bit.

In one or more embodiments, the modified parameter may not exist (e.g., the modified parameter creating a modified bit may have not been manufactured before). If the modified parameter does not exist, a validation request is sent in 805. The validation request may be sent in order to validate the feasibility of simulation and/or manufacturing of the modified parameter. Validation may be limited by physical capabilities, structural capabilities, and/or manufacturing capabilities. For example, a particular cutter may not be allowed to have certain angles based on the location of adjacent cutters. In addition, values for certain parameters of the drill bit may be unreasonable due to physical or manufacturing limitations. Accordingly, in one or more embodiments, the modified parameter may be deemed valid by meeting certain manufacturing standards or requirements. Manufacturing limits may include, but not limited to, size and shape or material of any component of the drilling tool assembly. In addition, in one or more embodiments, the modified parameter may be deemed valid by meeting specific threshold limitations. One of ordinary skill in the art would know and appreciate that the validation may be limited by any other constraints known in the art.

In 807, the modified parameter undergoes validation. If the modified parameter is determined to be invalid, a parameter is suggested to the user in 809. If the modified parameter is determined to be valid, the modified parameter is presented to the user along with other parameter(s), in 811, to be selected by the user using a graphical user interface.

Figure 9:
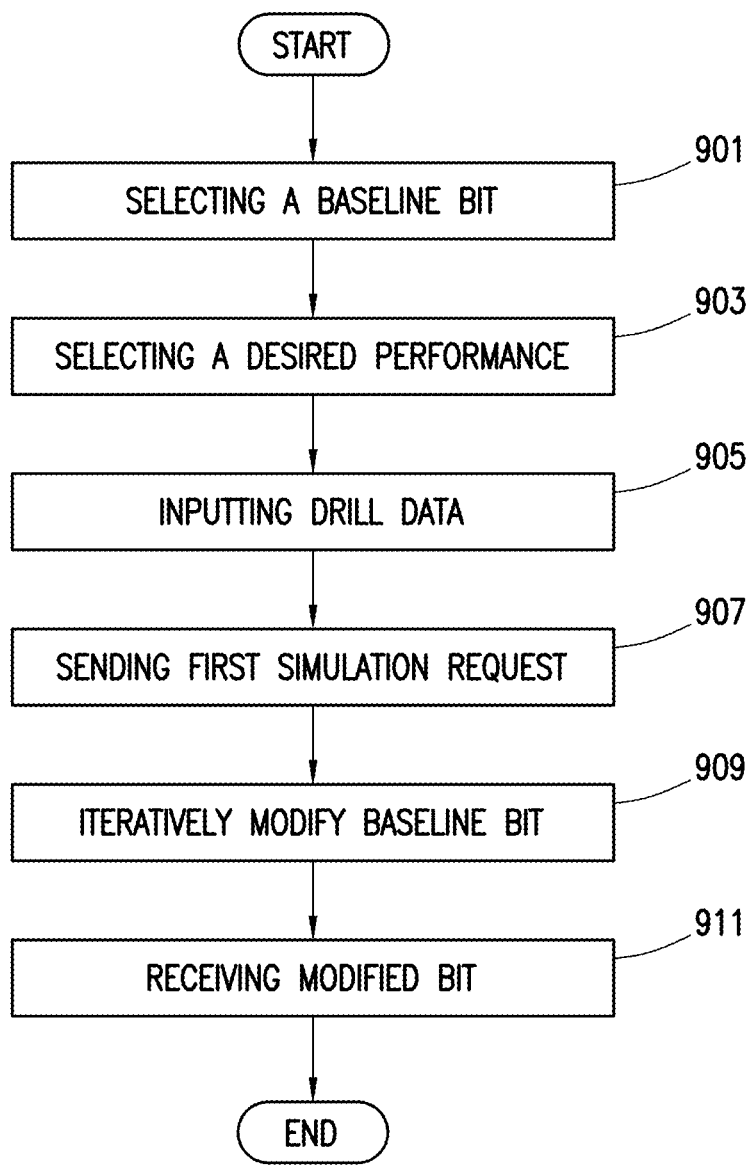

In FIG. 9, a flow chart illustrating a method of modifying a bit in accordance with one or more embodiments is shown. One or more of the modules shown in FIG. 9 may be omitted, repeated, and/or substituted. Accordingly, embodiments of selecting a drill bit or modifying a drill bit design should not be considered limited to the specific arrangements of modules shown in FIG. 9.

As shown in 901, a baseline bit may be selected. The baseline bit may be selected by a user using a graphical user interface on a computing device, such as the computing device 412 shown in FIG. 4. Using the graphical user interface, desired performance criteria may be selected by the user in 903. The performance criteria may be a threshold or calculation based on a variety of drilling factors, geologic conditions or production specifications. In addition the desired performance criteria may correspond to a particular rate of penetration, weight on bit, or contact area.

Similar to the above, using the graphical user interface, a user may input a variety of drilling data in 905. Drilling data may include, for example, rate of penetration, rotary speed, rotary torque, weight on bit, depth of cut, inclination angle, azimuth direction and a rock profile. One of ordinary skill would understand that drilling data is not limited to the aforementioned variables. As discussed above, a user may use the graphical user interface via any input means known in the art (e.g., input device(s) 424 as shown in FIG. 4).

A simulation request may be sent to a server in 907. The simulation request may include the input drilling data, the desired performance datum and the baseline bit. Once the simulation request is received by the server, the server may execute, or instruct a simulator to execute, a simulation based on the simulation request. A parameter of the baseline bit in 909 may be modified to obtain a modified bit.

Modifying the baseline bit may include modifying or changing at least one drilling parameter known in the art, such as, any parameter of the drill bit including angle of a cutter, diameter of a cutter, geometry of a cutter, bevel, length of a cutter, material properties of a cutter, exposure of a cutter, depth of cut, carbide inserts behind the primary and/or backup cutters, backup cutter properties, blade properties, gage pad properties, type of bit, size of bit, shape of bit, material properties of bit, number of backup cutters, backup cutters properties, number of blades, blade properties, and/or bit diameter, for example. The modification of the baseline bit may be iteratively modified during simulation until the desired performance datum is met. The desired performance datum may be, for example, any one or a combination of rate of penetration, depth of cut, drilling data, etc.

The modified bit may be simulated and compared to the desired performance datum. If the desired performance datum is met by the modified bit, the simulation halts. On the other hand, if the modified bit does not meet the desired performance datum, a parameter of the modified bit is modified to obtain a second modified bit. The second modified bit may then be simulated and compared to the desired performance datum. As shown, 909 is iterative and thus, repeating of the modification of a parameter of the modified drill bit will continue until the desired performance datum is met.

Once the simulation completes, the modified drill bit is received in 911 and may be presented to the user on a graphical user interface. The graphical user interface may be executed on a computing device at a location different from or the same as the server on which the simulation(s) executes.

In one or more embodiments, the graphical user interface may include one or more buttons (e.g., radio buttons), data fields (e.g., input fields), banners (e.g., menus, boxes (e.g., input or output text boxes), tables (e.g., data summary tables), sections (e.g., informational sections or sections capable of minimizing/maximizing), screens (e.g., welcome screen or home screen), and/or user selection menus (e.g., drop down menus). The graphical user interface may include one or more separate interfaces and may be usable in a web browser or as a standalone application. One of ordinary skill in the art will appreciate that the graphical user interface of the present disclosure should not be limited to the layouts, configurations, etc., as depicted in the following examples.

Figure 10A:
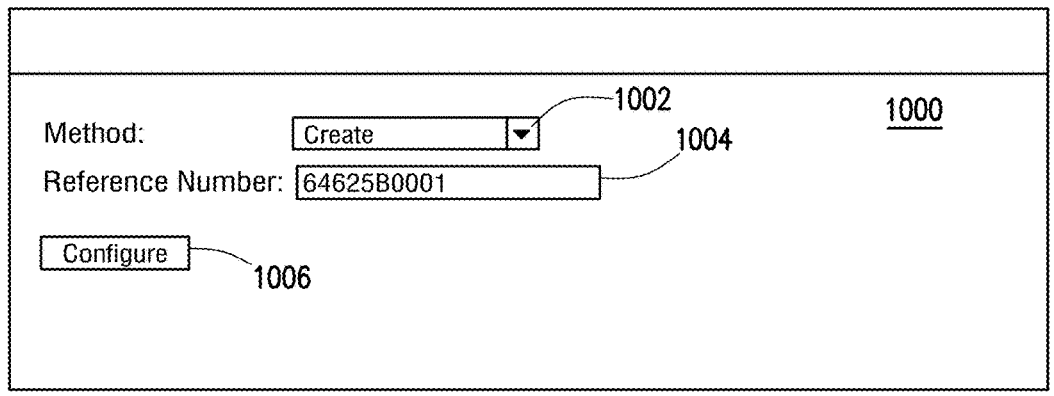
Figure 10B:
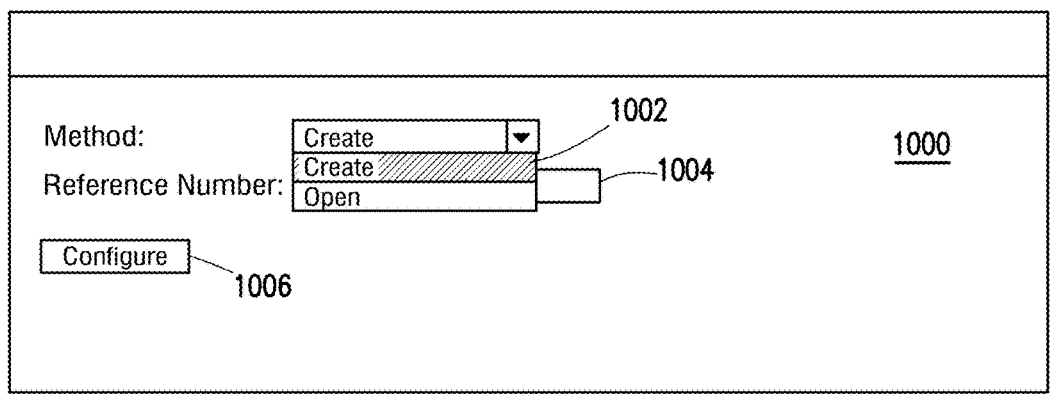

FIGS. 10A-10C show examples of a graphical user interface in accordance with one or more embodiments of the present disclosure. One or more of the modules and elements shown in FIGS. 10A-10C may be omitted, repeated and/or substituted. Accordingly, embodiments of selecting a drill bit or modifying a drill bit design should not be considered limited to the specific arrangements of modules shown in FIGS. 10A-10C.

As shown in FIGS. 10A-10B, a user may be presented with a bit configurator 1000 (i.e., GUI). The bit configurator 1000 may be accessible via a network (e.g., the Internet or Intranet), or may be standalone for use with any computing device known in the art. The bit configurator 1000 may include a drop down menu 1002 with options to create or open a previous bit configuration. The previous bit configuration may be entered by the user using reference number input 1004. Once a user selects a method from the drop down menu 1002 and inputs a reference number in reference number input 1004, the user may configure a bit using the configure button 1006.

FIG. 10C illustrates a welcome screen for configuring a bit via fast track. Fast track may be used for configurations that may be desirable to configure a drill bit in a timely manner. The application shows the ability to fast track the entire bit body or cutting structure to provide a custom delivery schedule. As shown in FIG. 10C, the reference number input 1004 and a reference design input 1006 may be presented. In addition, if applicable, a cutting structure summary 1008 may be presented indicating the build specification. The build specification may include one or more design parameters such as number of cutters of a particular size, the size and type of the bit, or any other drilling parameter available to the user.

One of ordinary skill will know and appreciate that the graphical user interface (buttons, menus, banners, etc.) may not be limited to that which is shown in FIGS. 10A-10C. Any number of configurations, layouts, etc., may be considered.

FIGS. 11A1-11E show examples of a graphical user interface in accordance with one or more embodiments of the present disclosure. One or more of the modules and elements shown in FIGS. 11A1-11E may be omitted, repeated and/or substituted. Accordingly, embodiments of selecting a drill bit or modifying a drill bit design should not be considered limited to the specific arrangements of modules shown in FIGS. 11A1-11E.

Figure 2:
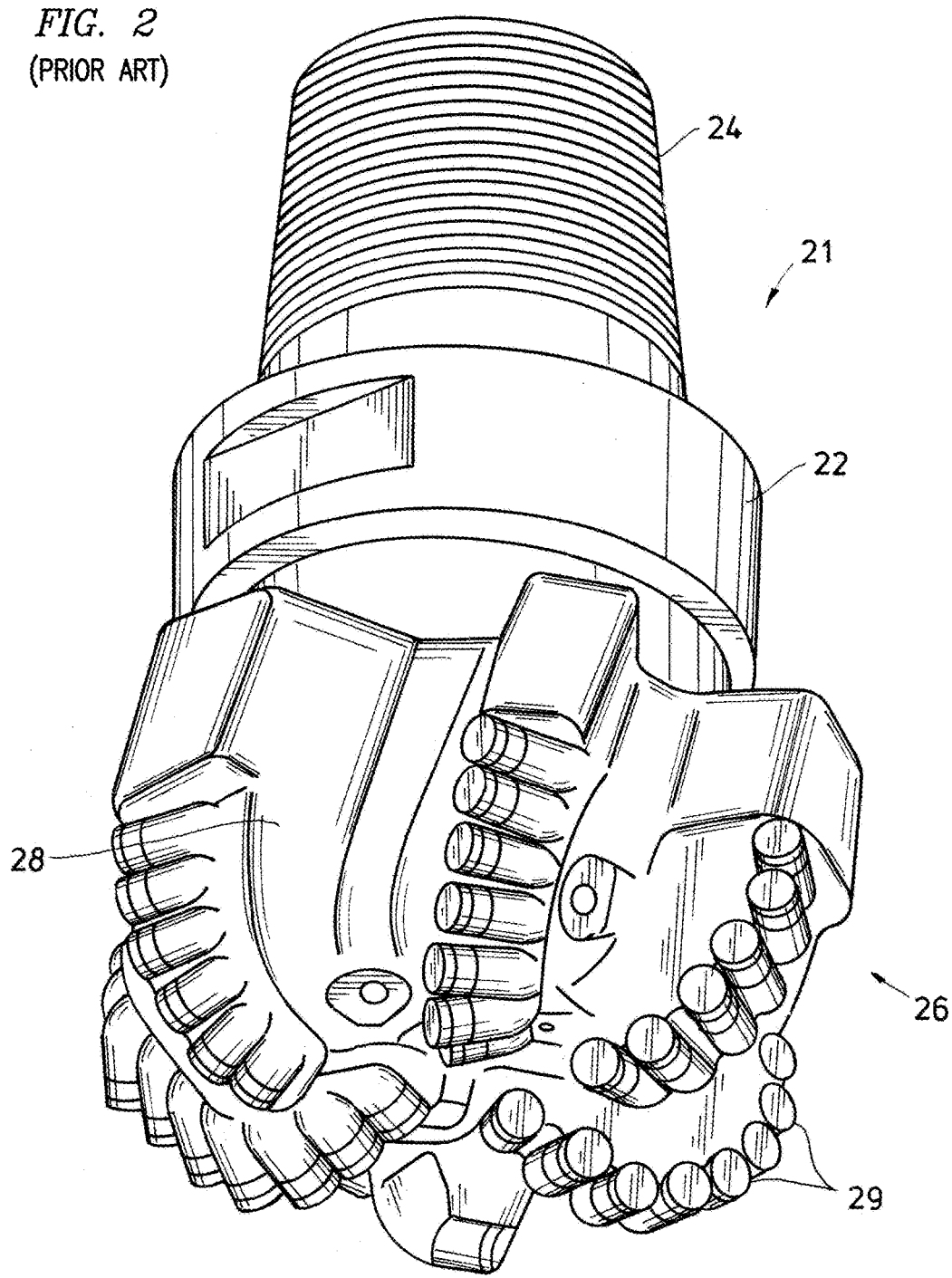
FIG. 2 shows a conventional fixed-cutter bit.
Figure 3:
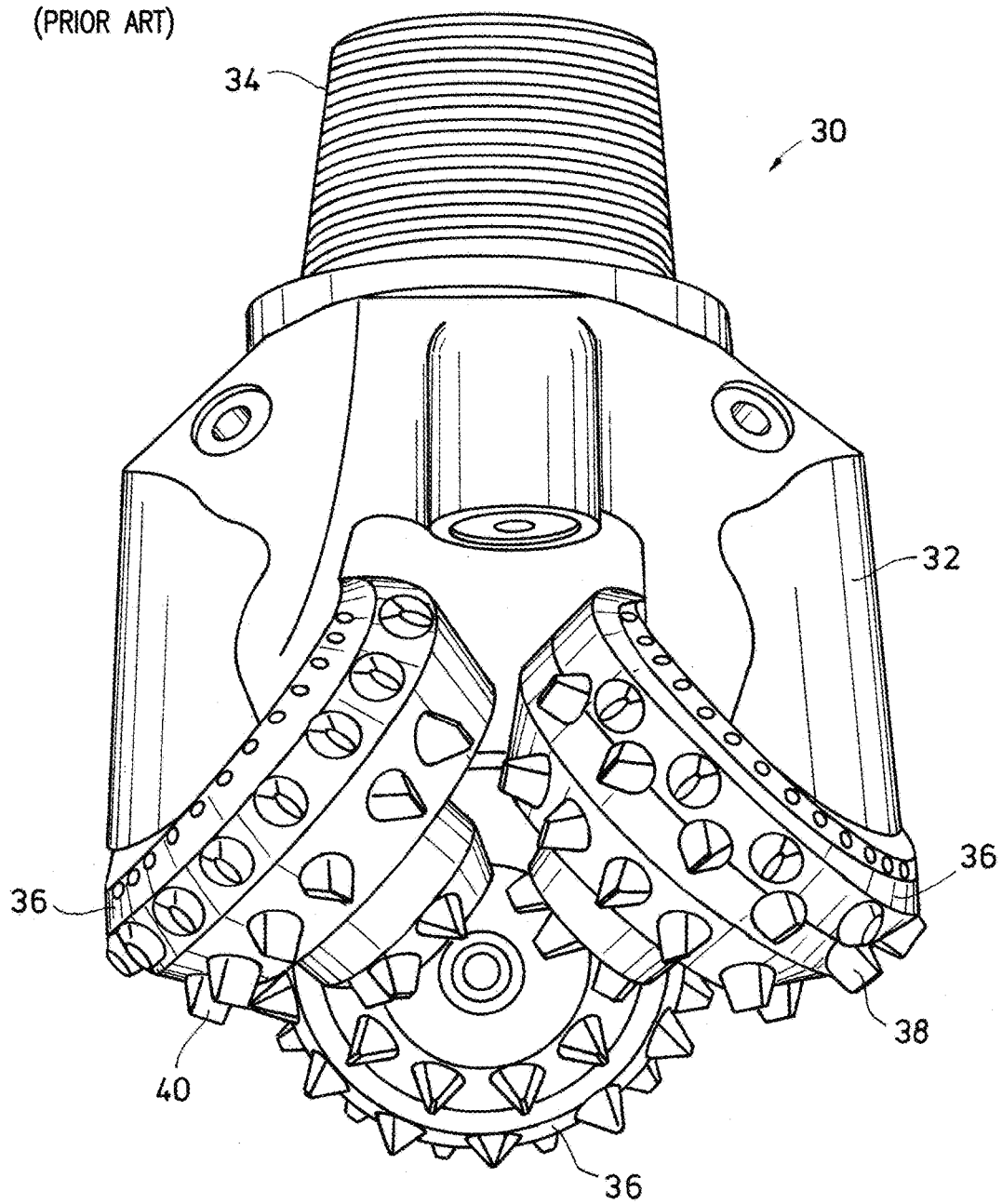
FIG. 3 shows a conventional roller cone bit.

As shown in FIGS. 11A1-11A2, the bit configurator 1100 may include customer information 1102 and a number of drilling parameters 1104. The drilling parameter 1104 may include a number of drill bit parameters 1106, fast track parameters 1108, common parameters 1110, among others. The drilling parameters 1104 may also include cutter filters 1112 including grade and bevel, for example.

The drill bit parameters 1106 may include different structures such as a cone, nose, shoulder, and gage, as shown. Similarly, fast track parameters 1108 may include a number of different options including drop down menus and user input available for selecting, changing or modifying by a user. Common parameters 1110 may include additional structural or other parameters available for selecting, changing or modifying by a user.

As shown in FIGS. 11B1-11B2, drilling parameters 1104 may be filtered by the cutter filters 1112. In addition, drill bit parameters 1106 may include expandable options for different parameters. As shown in this example, the nose parameter is expanded to present different options available for selection by a user. The different options include size 1106A, build specification 1106B, cutter part number 1106C and a description 1106D.

As shown in FIGS. 11C1-11C2, fast track parameters 1108, common parameters 1110, and other options 1114, each may include expandable options (e.g., 1108A), drop down menus (e.g., 1110A), one or more checkboxes (e.g., 1114A), and user input (e.g., 1114B). As shown in FIG. 11D, simulation values 1116 may include expandable options (e.g., 11116A), drop down menus (e.g., 1116B), and user input (e.g., 1116C). One of ordinary skill in the art would know and appreciate that any option of the bit configurator 1100 may include any of expandable options, drop down menus, one or more checkboxes, and user input, and should not be limited to the above options, layout, or parameters, among others.

Figure 11E:
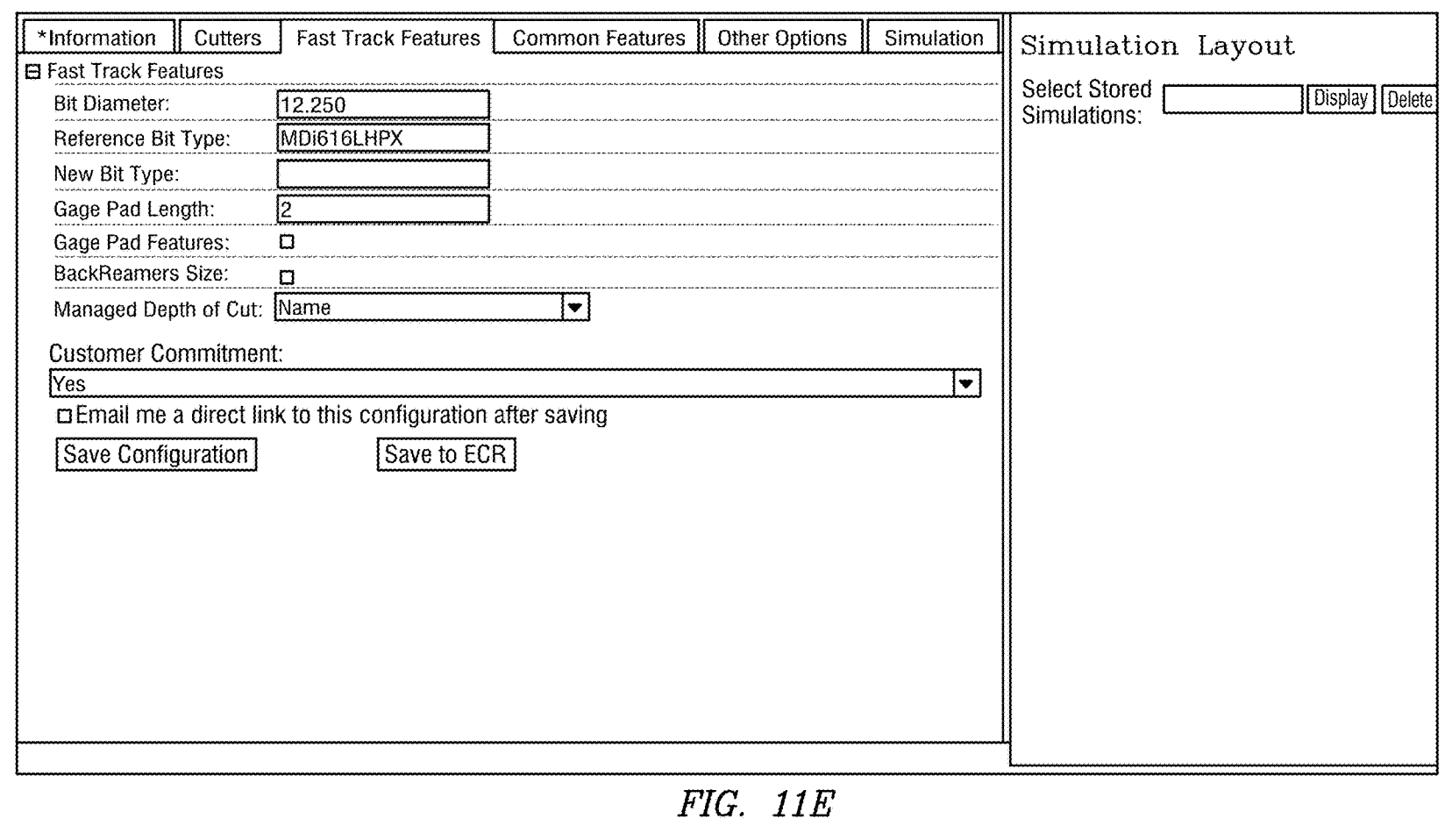

Referring now to FIG. 11E, an example of a tabbed interface in accordance with one or more embodiments of the present disclosure is shown. The tabbed interface is an example of one of the interfaces used to display different menu options, sections and/or parameters of a drill bit, among others.

One of ordinary skill will know and appreciate that the graphical user interface (buttons, menus, banners, etc.) may not be limited to that which is shown in FIGS. 11A-11E. Any number of configurations, layouts, etc., may be considered.

Figure 12A:
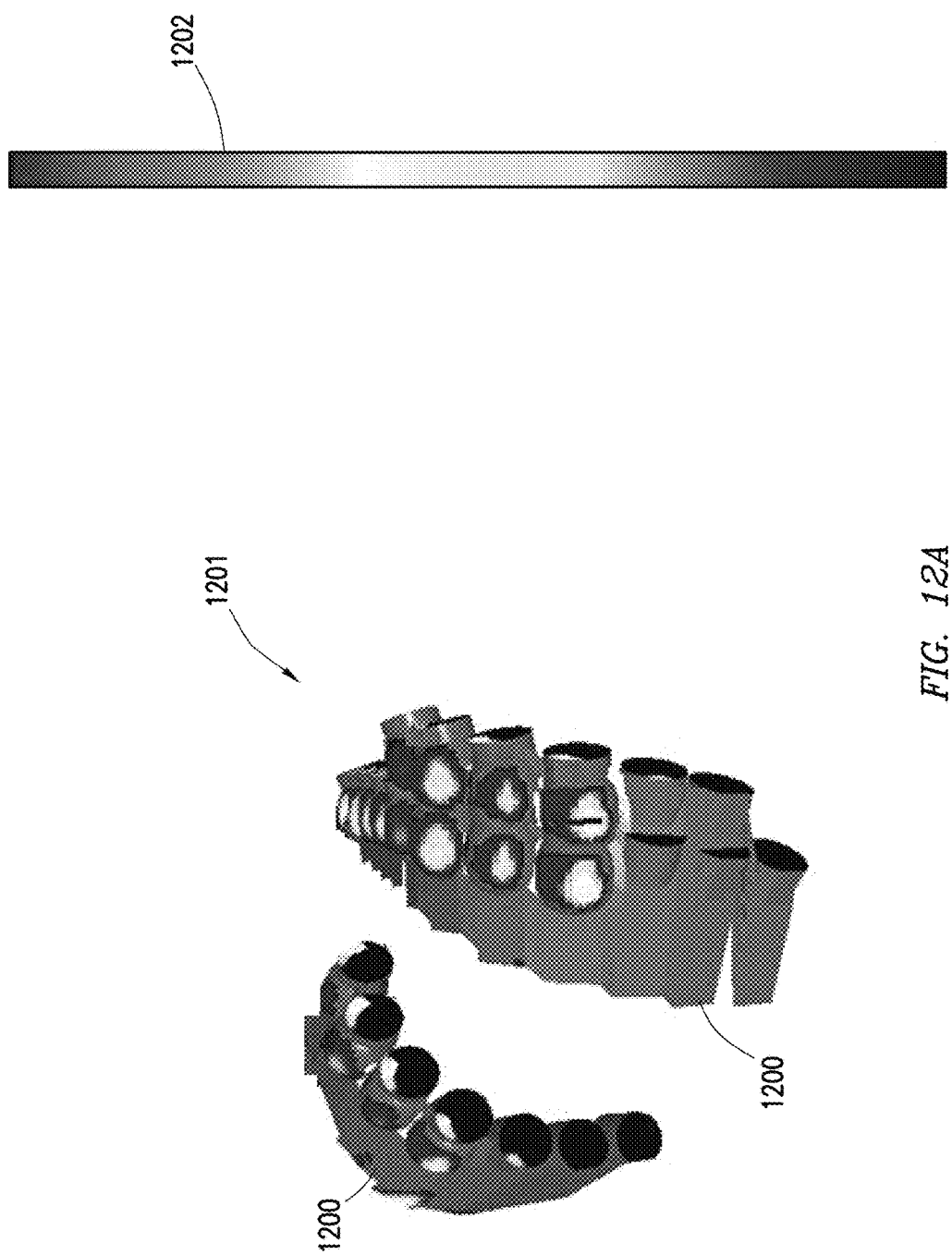
FIGS. 12A-12B show examples of a graphical user interface in accordance with one or more embodiments.
Figure 12B:
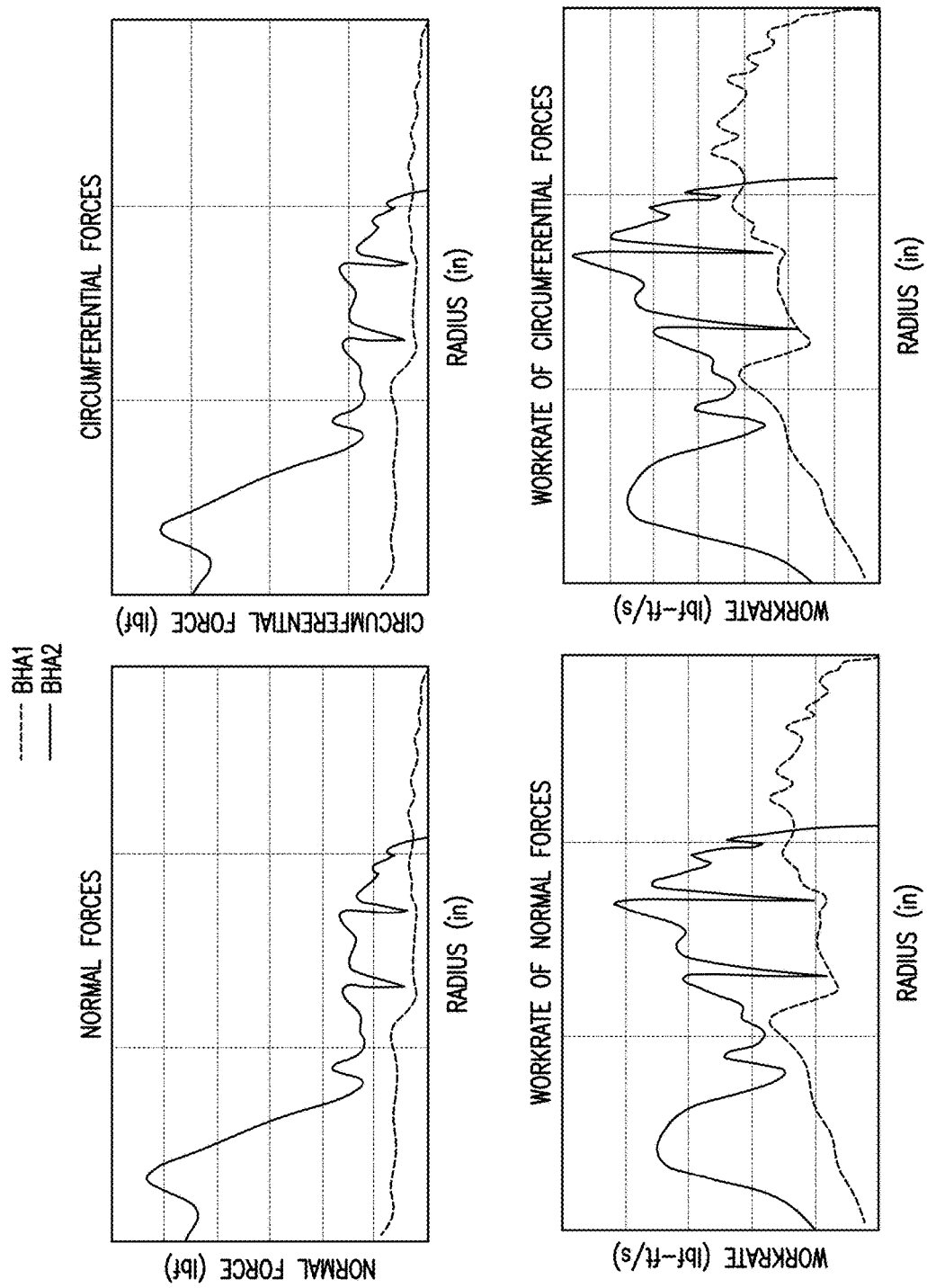

FIGS. 12A-12B show examples of a graphical user interface in accordance with one or more embodiments of the present disclosure. One or more of the modules and elements shown in FIGS. 12A-12B may be omitted, repeated and/or substituted. Accordingly, embodiments of selecting a drill bit or modifying a drill bit design should not be considered limited to the specific arrangements of modules shown in FIGS. 12A-12B.

Data presented in FIGS. 12A-12B may be visualized or rendered by any means known in the art. Data may be presented as tabular data, line graphs, plots, charts or any combination thereof. Data also may be rendered in 2D or 3D. Colors may be used in visualization and/or rendering.

In some embodiments, as shown in FIGS. 12A-12B, the simulation provides visual outputs. In one embodiment, the visual outputs may include performance parameters. Performance parameters, as used herein may include rate of penetration (ROP), forces encountered, average forces (including but not limited to vibrational, torsional, lateral and axial), contact area, bit geometry, bit stability. In addition, the outputs may include tabular data of one or more performance parameters. Additionally, the outputs may be in the form of graphs of a performance parameter and may be represented as ratios or percentages. A graphical visualization of the drill bit, blades, cutters, may be output. The graphical visualization (e.g., 2-D, 3-D, or 4-D) may include a color scheme.

In particular, after a simulation is executed, the simulation may generate a set of performance data. The performance data may be rendered for analysis as shown in FIG. 12A. FIG. 12A depicts a rendering of two blades 1200 of a drill bit 1201 output after simulation. The blades 1200, as shown, may include several cutting elements, each of which may be simulated individually or as a portion or the entirety of the drill bit to be simulated. The colors visualized from the simulation may correspond to the set of performance data.

FIG. 12A also includes a scale 1202 to aide in analyzing the presented data. The color represents, in this example, the relative amount that each portion of each cutter contacts the formation (contact area). One of ordinary skill would appreciate that although two blades are shown in FIG. 12A, any number of blades of the drill bit may be shown and illustrated.

In one or more embodiments, the simulation may generate plots, line graphs, pie charts, bar graphs, tabular data, graphs or any other means of representing data known in the art. The charts may include one or more axes and may generate 2D, 3D or 4D representations of data. The represented data may include legends, scales, local minimums or maximums, or any other representative element known in the art.

As shown in FIG. 12B, the generated plots, charts, etc., may be based on one or more drill bits to be presented for further analysis, review and/or comparison. As shown in FIG. 12B, for example, normal forces, circumferential forces, and their corresponding work rates for two drill bits are presented for analysis and comparison. One or ordinary skill in the art would know and appreciate that the performance data to be presented may be any data known in the art or described herein.

Figure 13A:
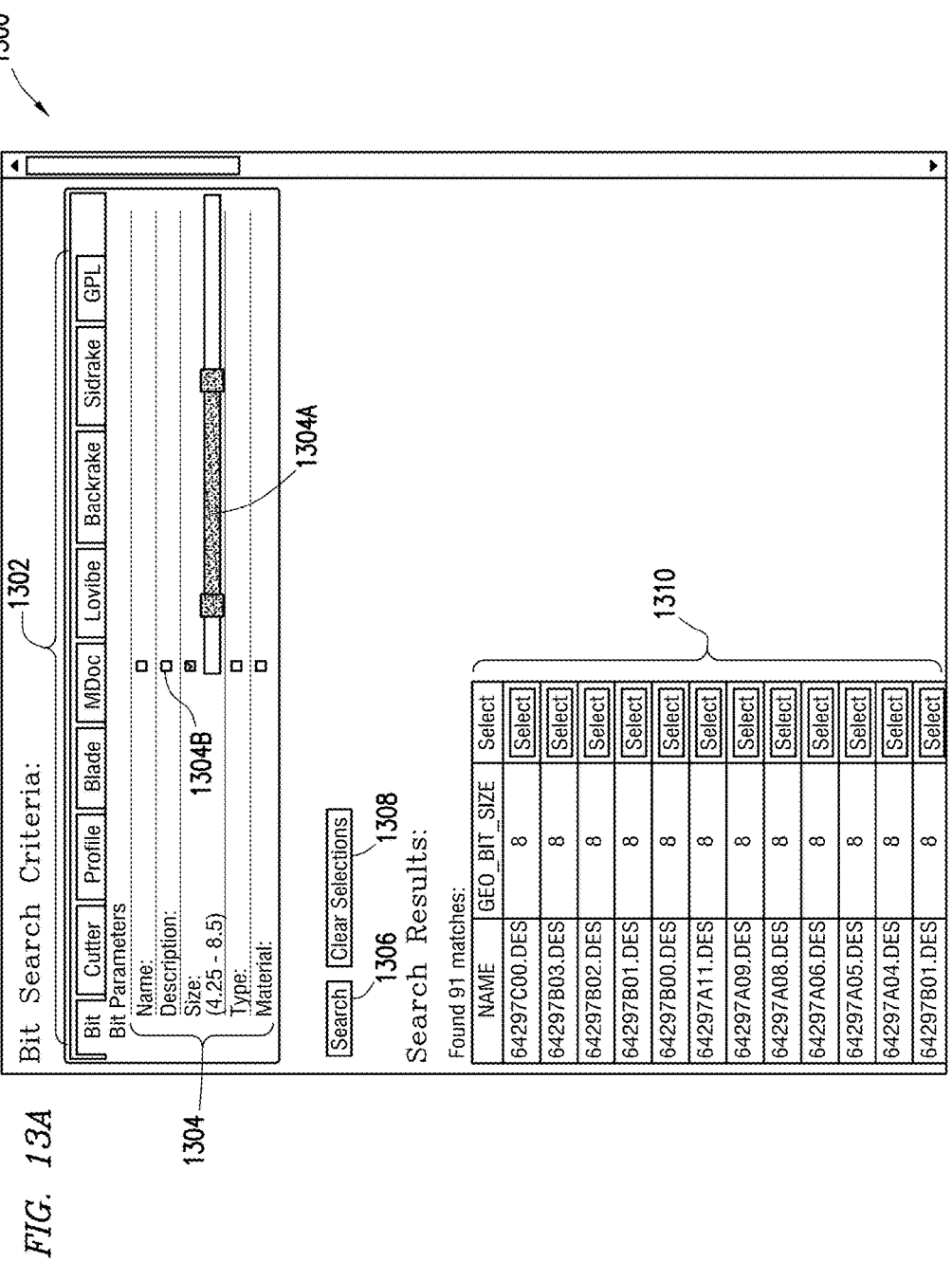
FIGS. 13A-13B show examples of a bit search graphical user interface in accordance with one or more embodiments.
Figure 13B:
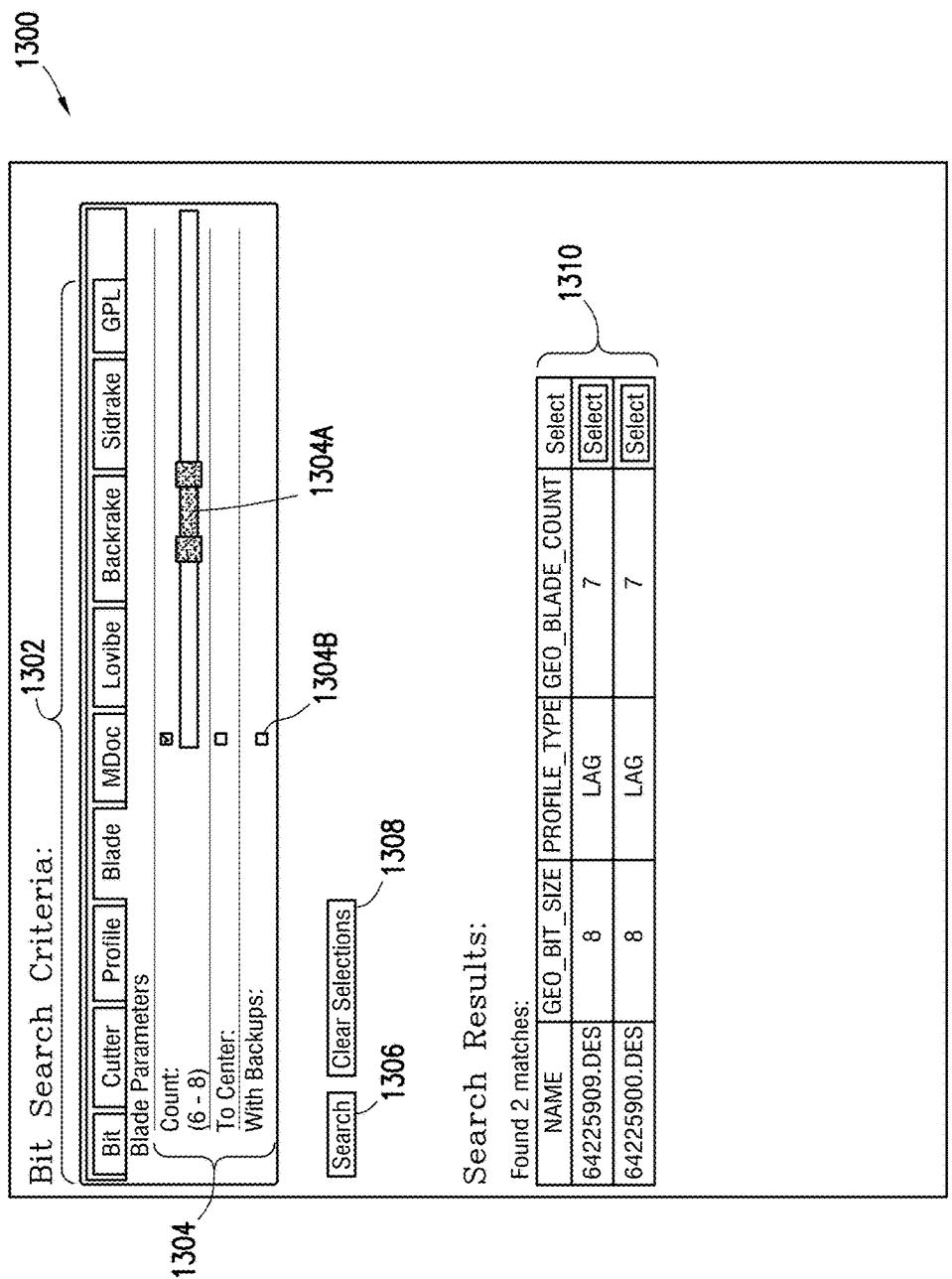

FIGS. 13A-13B show examples of a bit search graphical user interface in accordance with one or more embodiments of the present disclosure. One or more of the modules and elements shown in FIGS. 13A-13B may be omitted, repeated and/or substituted. Accordingly, embodiments of selecting a drill bit or modifying a drill bit design should not be considered limited to the specific arrangements of modules shown in FIGS. 13A-13B.

As shown in FIGS. 13A-13B, a user may search for one or more bits, BHAs, and/or BHA components using a bit search 1300. The bit search 1300 may be operated by a user using a GUI, for example. The bit search 1300 may be accessible via a network (e.g., the Internet or Intranet), or may be standalone for use with any computing device known in the art. The bit search 1300 may include a number of categories 1302 that may be used to define or further refine search criteria. The categories 1302 may include a number of options modifiable by a user. As shown, options may include, but not limited to bit, cutter, profile, and blade options, among others. In this manner, the user may select previously used bits, for example, and use them as a baseline bit prior to modifying the bit for a particular application.

Further, in this example, the categories 1302 are illustrated on a GUI as tabs, but may be illustrated as any GUI element known in the art, such as buttons or drop down menus, among many others. In addition, the categories may be associated with one or more parameters 1304. The parameters 1304 may be modifiable using one or more GUI elements, such as a slider 1304A, or checkboxes 1304B. Those having ordinary skill would know and appreciate that any number of GUI elements or parameters may be used by a user to define or refine search criteria.

After determining the search criteria, a user may trigger a search using a button, such as search button 1306. Once a search is triggered, a number of results 1301 may be displayed that satisfy the search criteria defined by the user. The results 1310 may be organized in a table, list, graph, plot, or by any other means known in the art. Further, the user may define search criteria based on capabilities of a BHA to perform certain operations or to operate at particular operating parameters. For example, a user may search for drill bits capable of maintaining a specific ROP when drilling a particular type of earth formation. In addition, a user may search for a component capable of reducing normal forces by a given percentage. Moreover, a user may clear the search criteria to define new search criteria using a clear search button 1308.

Figure 14A:
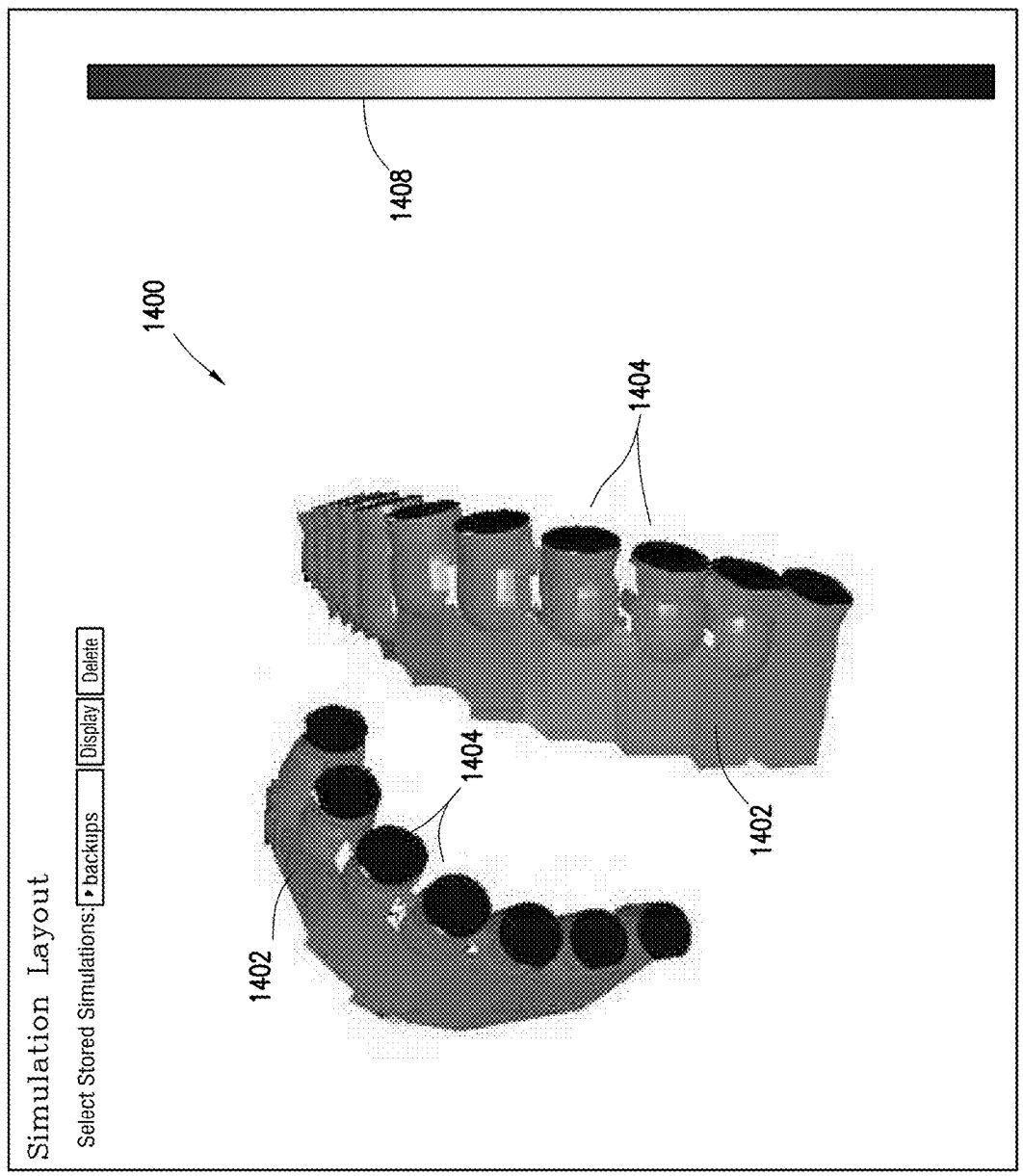
FIGS. 14A-14B show examples of visualizations in accordance with one or more embodiments.
Figure 14B:
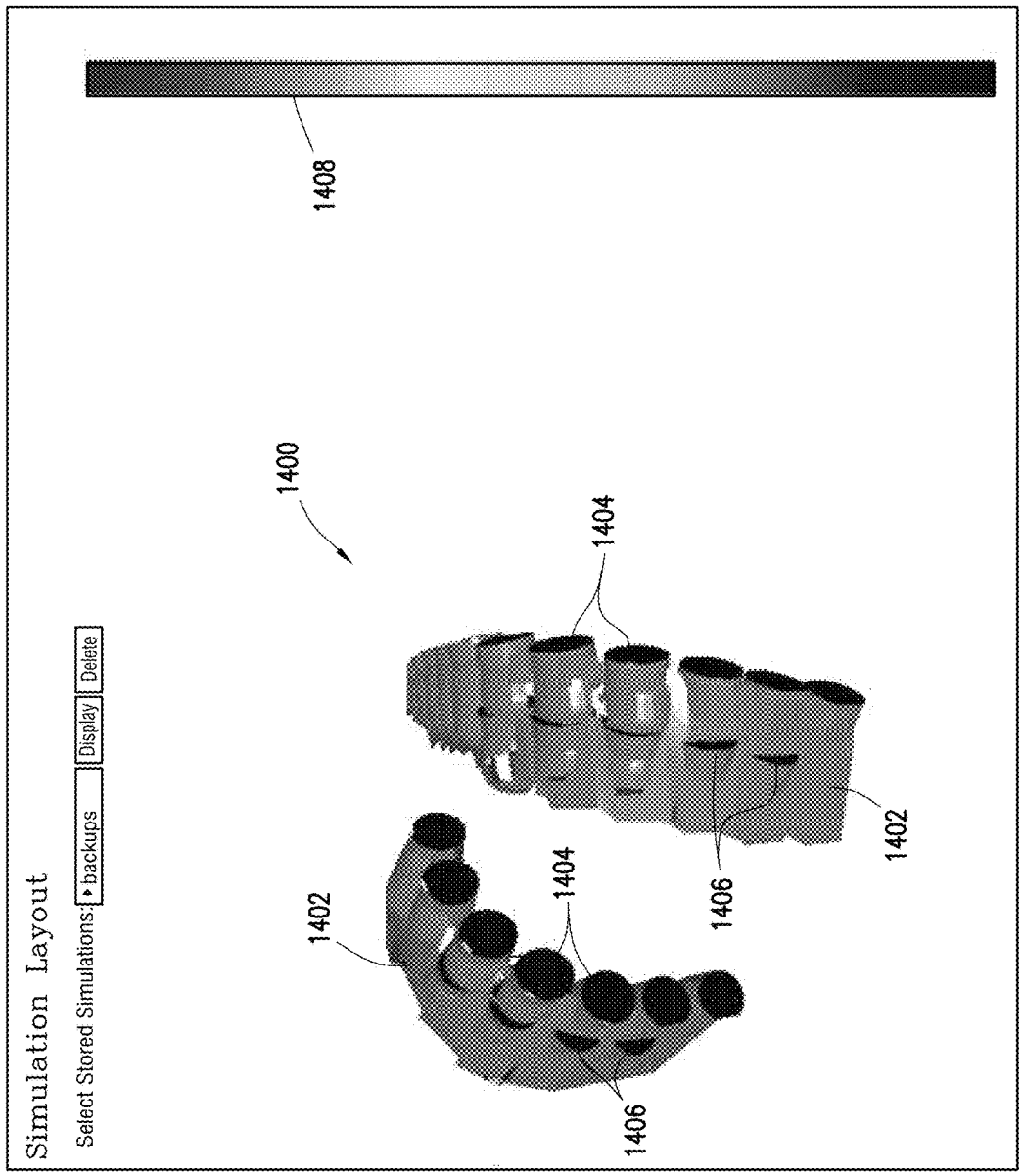

FIGS. 14A-14B show examples of visualizations in accordance with one or more embodiments of the present disclosure. One or more of the modules and elements shown in FIGS. 14A-14B may be omitted, repeated and/or substituted. Accordingly, embodiments of selecting a drill bit or modifying a drill bit design should not be considered limited to the specific arrangements of modules shown in FIGS. 14A-14B.

After a user selects a bit, BHA, or BHA component, the user may visualize the component on a GUI, for example. As shown in FIG. 14A-14B, blades 1402 and cutters 1404 of a drill bit 1400 are visualized in 3D. The user may select and/or modify any number of parameters to be visualized. For example, as shown in FIG. 14B, backup cutters 1406 are also illustrated in addition to blades 1402 and cutters 1404 of drill bit 1400. Further, scale 1408 may be used to visualize other parameters or performance characteristics. In one or more embodiments, the scale 1408 may be a color scale and may represent the contact area of each of the cutters when operating. One of ordinary skill would appreciate that although two blades are shown in FIGS. 14A-14B, any number of blades of the drill bit may be shown and illustrated. In this manner, the user may be able to look at the effects of changes on the overall bit design, and add, move, and/or remove various features of the bit, such as cutter placement, nozzle placement, orientation, number of cutters, size of cutters, among other options. The user can repeatedly modify the bit, and view the resultant changes.

Although illustrated in 3D, visualizations may be shown in 3D, 2D, or using any other visualization known in the art. In addition, the visualization may be interactive. For example, a user may rotate the visualization or may rotate one of the blades 1402 of the drill bit 1400. Further, a user may select a blade or a cutter to generate or determine more specific characteristics of the selection and/or the user may select a portion of the visualization to be magnified or minimized.

One or more embodiments of the present disclosure allows for a drilling engineer, or any other user, to efficiently select or modify a drill bit. Access to simulation results, models, and data for comparison of one or more drill bits (either to one another or to specific criteria) can help engineers determine an optimal or appropriate drill bit to be used for drilling. Additionally, when access to resources (computational or storage resources, for example) are limited (e.g., at a well site), drilling engineers may still have access to information and customization options that would otherwise be unavailable. In these and other circumstances, one or more embodiments of the present disclosure provide data to drilling engineers while enabling customizable set of drilling parameters on a user friendly graphical user interface.

Thus, by analyzing various drill bit parameters, a designer can select the optimal drill bit for specific criteria, performance, drilling requirement, etc. Selected embodiments provide for a method and system by which various drill bits packages can be simulated and their performance analyzed. Given an optimizing criteria, multiple drill bits can be quickly assessed to determine an optimal drill bit for a drilling application.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the disclosure. Further, portions of the systems and methods may be implemented as software, hardware, firmware or combinations thereof.

Although a few example embodiments have been described in detail above, those skilled in the art will readily appreciate that many modifications are possible in the example embodiments without materially departing from this disclosure. Accordingly, any such modifications are intended to be included within the scope of this disclosure. Moreover, embodiments disclosed herein may be practiced in the absence of any element which is not specifically disclosed.

In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A system for field selecting drill bits, comprising:
a server residing at a first location, and comprising a computing processor executing instructions to perform:
receiving a first simulation request,
executing, based on the first simulation request, a first simulation to generate a first set of performance data,
receiving a second simulation request, and
executing, based on the second simulation request, a second simulation to generate a second set of performance data; and
a computing device communicatively coupled to the server, residing at a second location, and comprising a graphical user interface executing on a computer processor with functionality to perform:
selecting a baseline bit from a library of bits,
inputting a plurality of drilling data,
sending the first simulation request comprising the baseline bit and the plurality of drilling data,
receiving the first set of performance data,
presenting the first set of performance data for review,
modifying a parameter of the baseline bit, wherein modifying involves limiting available values of the parameter to a set of pre-existing values based on manufacturing capabilities or geometries of the baseline bit, presenting the limited available values for selection of one of the pre-existing values, and receiving selection of one of the pre-existing values for the parameter to obtain a modified bit,
sending the second simulation request comprising the modified bit,
receiving the second set of performance data from the second simulation,
presenting, on the graphical user interface, the first set of performance data and the second set of performance data for review, and
selecting a drill bit based on the first and second sets of performance data.

2. The system of claim 1, wherein presenting further comprises:
visualizing, on the graphical user interface, the first set of performance data and the second set of performance data for comparison.

3. The system of claim 1, wherein the plurality of drilling data comprises at least one selected from the group consisting of rate of penetration, rotary speed, rotary torque, weight on bit, depth of cut, inclination angle, azimuth direction, and a rock profile.

4. The system of claim 1, wherein the first set of performance data comprises at least one selected from the group consisting of contact area, cutter forces, pull, circumferential forces, work rate, bit geometry, and bit stability.

5. The system of claim 1, wherein the second set of performance data comprises at least one selected from the group consisting of contact area, cutter forces, pull, circumferential forces, work rate, bit geometry, and bit stability.

6. The system of claim 1, wherein modifying the parameter of the baseline bit further comprises changing at least one selected from the group consisting of angle of a cutter, diameter of a cutter, geometry of a cutter, bevel, length of a cutter, material properties of a cutter, and exposure of a cutter.

7. The system of claim 1, wherein modifying the parameter of the baseline bit further comprises changing at least one selected from the group consisting of type of bit, size of bit, shape of bit, material properties of bit, number of backup cutters, backup cutters properties, number of blades, blade properties, addition of carbide inserts, gage pad properties, and diameter of bit.

8. The system of claim 1, wherein:
the computing processor of the server executes instructions to further perform:
receiving a validation request, and
evaluating feasibility of the validation request for simulation and/or manufacturability; and
modifying the parameter of the baseline bit includes sending the validation request to the server to validate feasibility of simulation and/or manufacturability of a proposed parameter, and receiving validation of the proposed parameter or a suggested parameter if the proposed parameter is invalid.

9. A system for field selecting drill bits, comprising:
a computer processor; and
a computing device comprising a graphical user interface executing on the computer processor with functionality to perform:
selecting a baseline bit from a library of bits,
inputting a plurality of drilling data,
modifying a parameter of the baseline bit, wherein modifying involves limiting available values for the parameter of the baseline bit to a set of pre-existing values based on location of adjacent structures on the baseline bit, presenting the limited available values for selection of one of the pre-existing values, and receiving selection of one of the pre-existing values for the parameter of the baseline bit to obtain a modified bit,
sending, to a server, a first simulation request comprising the modified bit and the plurality of drilling data,
receiving, from the server, a first set of performance data,
presenting the first set of performance data for review,
modifying a parameter of either the baseline bit or the modified bit, wherein modifying involves selecting a pre-existing value for the parameter of either the baseline bit or the modified bit to obtain a second modified bit,
sending, to the server, a second simulation request comprising the second modified bit,
receiving, from the server, a second set of performance data from the second simulation,
presenting the first set of performance data and the second set of performance data for review, and
selecting a drill bit based on the baseline set of performance data, the first set of performance data, and the second set of performance data.

10. The system of claim 9, wherein the graphical user interface executing on the computer processor comprises functionality to further perform:
sending, to the server, a baseline simulation request comprising the baseline bit and the plurality of drilling data,
receiving, from the server, a baseline set of performance data, and
presenting at least one selected from the group consisting of the baseline set of performance data, the first set of performance data, and the second set of performance data for review.

11. The system of claim 9, wherein the graphical user interface executing on the computer processor comprises functionality to further perform:

comparing at least one of the first set of performance data or the second set of performance data to drilling requirements.

12. The system of claim 9, wherein the plurality of drilling data comprises at least one selected from the group consisting of rate of penetration, rotary speed, rotary torque, weight on bit, depth of cut, inclination angle, azimuth direction, and a rock profile.

13. The system of claim 9, wherein each of the first set of performance data, the second set of performance data, and the baseline performance data, comprises at least one selected from the group consisting of contact area, cutter forces, pull, circumferential forces, work rate, bit geometry, and bit stability.

14. A method of field testing drill bit parameters, comprising:
   selecting, from a library of bits, a baseline bit on a graphical user interface at a first location;
   modifying a parameter of the baseline bit, wherein modifying involves limiting available values for the parameter to a set of pre-existing values based on commonly used values for drill bits, presenting the limited available values for selection of one of the pre-existing values, and receiving selection, on a graphical user interface, of one of the pre-existing values for the parameter to obtain a modified bit;
   sending, to a server residing at a second location, a first simulation request to perform a simulation comprising the modified bit;
   receiving a first set of performance data from the simulation;
   presenting, on the graphical user interface, the first set of performance data; and
   selecting a drill bit based on the first set of performance data.

15. The method of claim 14, further comprising:
   modifying a parameter of either the baseline bit or the modified bit;
   sending, to the server, a second simulation request to perform a second simulation;
   receiving a second set of performance data from the simulation; and
   presenting, on the graphical user interface, the first set of performance data and the second set of performance data.

16. The method of claim 15, further comprising:
   comparing, on the graphical user interface, at least one selected from the group consisting of the first set of performance data and the second set of performance data to a pre-selected criteria to determine whether the modified bit satisfies the pre-selected criteria.

17. The method of claim 16, wherein the pre-selected criteria depends on at least one selected from the group consisting of contact area, cutter forces, pull, circumferential forces, work rate, bit geometry, and bit stability.

18. The method of claim 15, wherein the first set of performance data comprises at least one selected from the group consisting of contact area, cutter forces, pull, circumferential forces, work rate, bit geometry, and bit stability.

19. The method of claim 15, wherein modifying the parameter comprises changing at least one selected from the group consisting of angle of a cutter, diameter of a cutter, geometry of a cutter, bevel, length of a cutter, material properties of a cutter, and exposure of a cutter.

20. The method of claim 15, wherein modifying the parameter comprises changing at least one selected from the group consisting of type of bit, size of bit, shape of bit, material properties of bit, number of backup cutters, backup cutters properties, number of blades, blade properties, addition of carbide inserts behind one or more cutters, gage pad properties, and diameter of bit.

* * * * *